United States Patent
Irie et al.

(10) Patent No.: US 6,222,477 B1
(45) Date of Patent: Apr. 24, 2001

(54) CASCADE A/D CONVERTER

(75) Inventors: Koichi Irie; Naoya Kusayanagi, both of Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 09/303,717

(22) Filed: Apr. 30, 1999

(30) Foreign Application Priority Data

| Jun. 16, 1998 | (JP) | 11-168532 |
| Feb. 9, 1999 | (JP) | 11-031337 |
| Feb. 15, 1999 | (JP) | 11-035577 |
| Feb. 15, 1999 | (JP) | 11-035583 |
| Feb. 15, 1999 | (JP) | 11-035584 |

(51) Int. Cl.[7] .................................... H03M 1/38
(52) U.S. Cl. .............................. 341/161; 341/155
(58) Field of Search .................... 341/155, 161, 341/118, 120

(56) References Cited

U.S. PATENT DOCUMENTS

| 4,370,643 | * | 1/1983 | Kitamura | 340/347 |
| 4,510,571 | * | 4/1985 | Dagostino et al. | 364/487 |
| 6,020,840 | * | 2/2000 | Ong | 341/155 |

* cited by examiner

Primary Examiner—Peguy JeanPierre
(74) Attorney, Agent, or Firm—Moonray Kojima

(57) ABSTRACT

A cascade A/D converter configured by connecting in cascade two or more stages of electronic circuits, each stage comprising a comparator to convert an analog input signal to a digital signal, a latch circuit to hold the output of the comparator, a D/A converter to convert the output of the comparator to an analog signal, and a subtractor to subtract the output of the D/A converter from the analog input signal; wherein are provided a waveform composition circuit to compose code changing waveforms in the comparators, a plurality of detecting devices for detecting each vicinity of code changing points for detecting the code changes in the comparators by receiving the changing waveforms in the waveform composition circuit as inputs, and an error correction circuit that rejects noise generated at the code changing points based on the outputs of the detecting devices; whereby errors due to noise are substantially eliminated.

18 Claims, 18 Drawing Sheets

FIG. 9
(g) ANALOG SUBTRACTER 11f OUTPUT
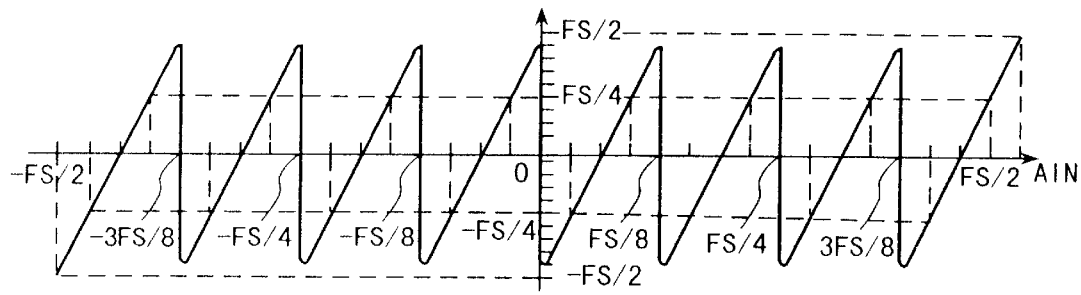
(h) COMPARATOR 8d OUTPUT
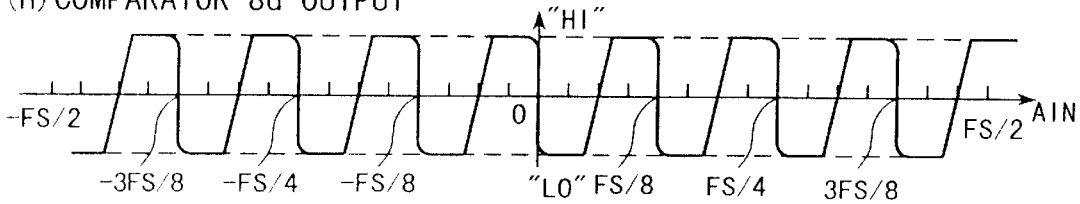
(i) AND 73a OUTPUT
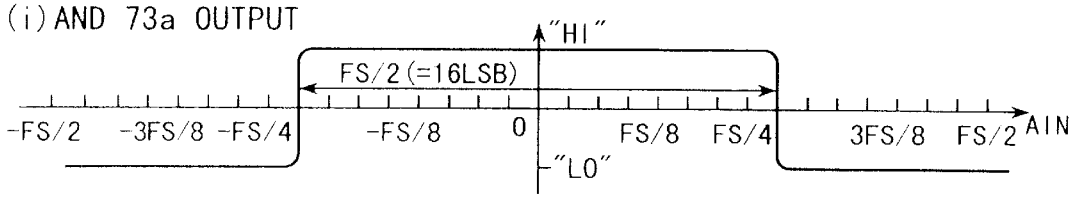
(j) AND 73b OUTPUT
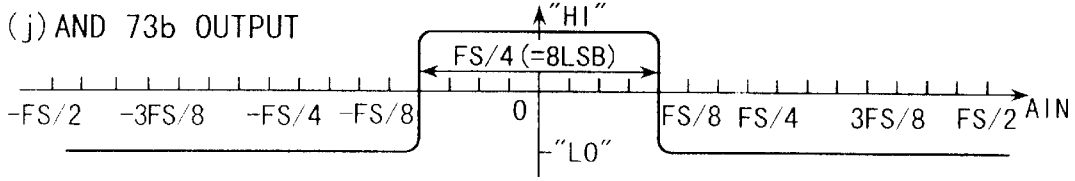
(k) AND 73c OUTPUT
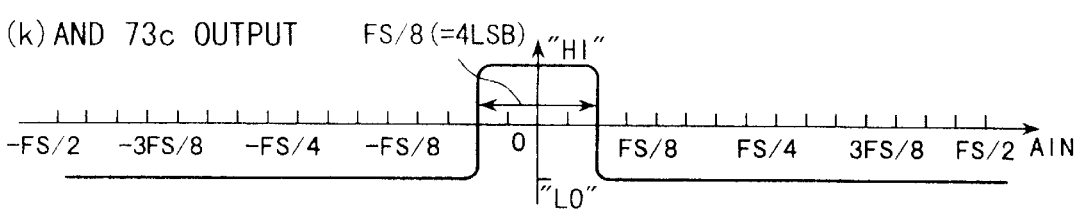

CASCADE A/D CONVERTER

BACKGROUND OF THE INVENTION

1. Field of Invention

This invention relates to a cascade A/D converter with error correction that is error free; and more particulary, to such converter that prevents generation of errors due to noise.

2. Description of the Prior Art

A/D converters include those which are of small scale, low power consumption and low input capacity. This type of converter uses a single clock and provides high speed operation. However, there is a problem of error generation in such converters. The inventors had disclosed in Japan Unexamined Application SN 9/238,077 (1997), a cascade A/D converter which uses a single clock and is operable without errors. Such a device is described in FIG. 1, which shows a cascade 5-bit A/D converter that outputs an alternate binary code (also called "gray" code). The device comprises comparators 8a–8d; latch circuits 9a–9e; D/A converters 10a–10c; subtractors 11a–11c; comparators 13a–13h; logical product circuits (called "AND circuits") 14–17; exclusive logical sum circuits (called "EOR circuits") 18–20; logical sum circuits (called "OR circuits") 21–23; and AND circuits 24, 25. Analog input signal 100a and digital output signal 101a are provided as shown.

Comparators 13a,3b and AND circuit 14 comprise window comparator 50a. Comparators 13c, 13d and AND circuit 15 comprise window comparator 50b. comparators 13e,13f and AND circuit 16 comprise window comparator 50c. Comparators 13g, 13h and AND circuit 17 comprise window comparator 50d. OR circuits 21–23 and and circuits 24,25 comprise error correction circuit 51.

Analog input signal 100a is applied to each non-inverted input terminal of comparators 8a and 13a, inverted input terminal of comparator 13b and the addition input terminal of subtractor 11a. The output terminal of comparator 8a is connected to latch circuit 9a, D/A converter 10a, and one input terminal of EOR circuit 18. The output terminal of D/A converter 10a is connected to the subtraction input terminal of subtractor 11a. The output terminal of comparators 13a and 13b are connected to the input terminals of AND circuit 14. The output terminal of AND circuit 14 is connected to one input terminal of OR circuit 21 and to the negative logic input terminals of AND circuits 15–17, 24 and 25.

The output terminal of subtractor 11a is connected to each noninverted input terminal of comparators 8b and 13c, inverted input terminal of comparator 13d and the addition input terminal of subtractor 11b. The output terminal of comparator 8b is connected to D/A converter 10b, the other input terminal of EOR circuit 18, and one input terminal of EOR circuit 19. The output terminal of D/A converter 10b is connected to the subtraction input terminal of subtractor 11b. Each output terminal of comparators 13c and 13d is connected to the other two positive logic input terminals of AND circuit 15, respectively. The output terminal of AND logic circuit 15 is connected to one input terminal of OR circuit 22 and each of the negative logic input terminals of AND circuits 16,17 and 25. The output terminal of EOR circuit 18 is connected to the other input terminal of OR circuit 21. The output terminal of OR circuit 21 is connected to the latch circuit 9b.

The output terminal of subtractor 11b is connected to each non-inverted input terminal of comparators 8c and 13e, the inverted input terminal of comparator 13f, and the addition input terminal of subtractor 11c. The output terminal of comparator 8c is connected to D/A converter 10c, the other input terminal of EOR circuit 19, and one input terminal of EOR circuit 20. The output terminal of EOR circuit 19 is connected to the other input terminal of OR circuit 22. The output terminal of OR circuit 22 is connected to the positive logic input terminal of AND circuit 24. The output terminal of AND circuit 24 is connected to latch circuit 9c. Each output terminal of comparators 13e and 13f is connected to the other two positive logic input terminals of AND circuit 16, respectively. The output terminal of AND circuit 16 is connected to one input terminal of OR circuit 23 and the negative logic input terminal of AND circuit 17. The output terminal of subtractor 11c is connected to the non-inverted input terminals of comparators 8d and 13g and the inverted input terminal of comparator 13h.

The output terminal of comparator 8d is connected to the other input terminal of EOR circuit 20. The output terminal of EOR circuit 20 is connected to the other input terminal of OR circuit 23. The output terminal of OR circuit 23 is connected to the positive logic input terminal of AND circuit 25. The output terminal of AND circuit 25 is connected to the latch circuit 9d. Each output terminal of comparators 13g and 13h is connected to the other two positive logic input terminals of AND circuit 17, respectively. The output terminal of AND circuit 17 is connected to latch circuit 9e. The output terminal of latch circuit 9a–9e are used to output digital output signal 101a.

The inverted input terminals of comparators 8a–8d are grounded. The voltages of +ΔV is applied to the non-inverted input terminals of comparators 13b,13d,13f, and 13h. The voltages of −ΔV is applied to the inverted input terminals of comparators 13a,13c,13e and 13g, respectively. However, ΔV=FS/32, wherein FS=full scale.

Operation of the device of FIG. 1 will now be described with refference to FIGS. 2 and 3, which show characteristic curves that indicate each output or each input for analog input signal 10a from −FS/2 to +FS/2. In FIGS. 2 and 3, lines (a) to (d) show the outputs of comparators 8a–8d; lines (e) to (h) show the outputs of window comparators 50a to 50d; lines (i) to (k) show the outputs of EOR circuits 18–20; and lines (l) to (p) show the inputs to latch circuits 9a–9e, respectively.

Comparators 8a–8d judge the zero crossing of analog input signal 100a, the output of subtractor 11a, the output of subtractor 11b, and the output of subtactor 11c, respectively.

Each of window comparators 50a–50d outputs a "high level" signal when the input signal is in each vicinity of "zero" and the output of the window comparator at the preceding stage is at a "low level" signal. Hence, window comparator 50a outputs a "high level" signal when analog input signal 100a is in each vicinity of "zero" as shown in line (e) of FIG. 2.

Window comparator 50b can output a "high level" signal when analog input signal 100a is in each vicinity of "zero" and "+FS/4" as shown in line (b) of FIG. 2. However, since the output signal from window comparator 50a, at the preceding stage is at a "high level" when analog input signal 100a is in each vicinity of "zero", window comparator 50b output "high level" signals only in each vicinity of "+FS/4" as shown in line (f) of FIG. 2.

Window comparator 50c can output a "high level" signal in seven positions as shown in line (c) of FIG. 2. However, since the positions where window comparator 50a or 50b at the previous states outputs a "high level" signal, are rejected, the output of window comparator 50c is of the waveform shown in line (g) of FIG. 2. Similarly, window comparator 50d can output a "high level" signal in 15 positions, as shown iin line (d) of FIG. 2. However, since the positions where window comparator 50a, 50b, or 50c at the previous stages outputs a "high level" signal are rejected, the output of window comparator 50d is of the waveform shown in line (h) of FIG. 2.

The output signals from EOR circuit 18–20 comprise "gray codes" of intermediate bits in digital output signal 101a; but, it is known that the output signals generate spike like noise as shown in lines (i)–(k) of FIG. 3. This is caused because the changes of signals from "high level" to "low level" or from "low level" to "high level" are not steep. Error correction circuit 51 rejects or eliminates the spike like noise as shown in lines (m)–(o) of FIG. 3, by correcting the portions where the spike like noise is generated using the output signals from the window comparators 50a–50d. That is, the spike like noise, shown in lines (i)–(k) of FIG. 3 is eliminated or rejected by masking with the output signal from window comparator 50a, the output signals from window Comparators 50a,50b, and the output signals from window comparators 50a, 50b, and 50c, respectively.

The output signals from window comparators 50a–50c act to change to "high level" in a certain region (called "window width") near the code changing points to establish all the lower codes. Considering the first stage window comparator 50a, the second bit is forced to a "high level" and the third bit, fourth bit and the least significant bit (LSB) which is the fifth bit are forced to "low level" near the changing point for the most significant bit (MSB).

The window widths for establishing each bit are not required to be essentially the same. As shown in line (m) of FIG. 3, the region in which the second bit is changed to "high level" can be up to a half of a full scale. As shown in line (n) of FIG. 3, a region of up to ¼ of the full scale can be allowed for the third bit. The allowable window width becomes narrower as the bit becomes lower and at the least significant bit (LSB) as shown in line (p) of FIG. 3, the upper limit of window width becomes ¹⁄₁₆ of the full scale, or 2 LSB.

However, since window comparator 50a that detects the changing points for MSB propagates its output to the lower bits, the window width must be constant. For example, the window width for making the second bit at a "high level" at the MSB changing point must be the same as the window width for carrying the LSB to a "low level" Accordingly, a problem arises when the window width comes near the noise level with high resolution, namely, that an error is generated in the code of the second bit where the window comparator 50a malfunctions due to noise.

SUMMARY OF THE INVENTION

Accordingly, an object of the invention is to overcome the aforementioned and other deficiencies and disadvantages of the prior art.

Another object is to provide a cascade A/D converter which substantially eliminates error generation due to noise.

BRIEF DESCRIPTION OF THE DRAWINGS

FIG. 9, comprising lines (g)–(k), is a diagram depicting characteristic curves illustrating operation of the embodiment of FIG. 7.

DETAILED DESCRIPTION OF THE PREFERRED EMBODIMENTS

First Illustrative Embodiment

Figure 1:
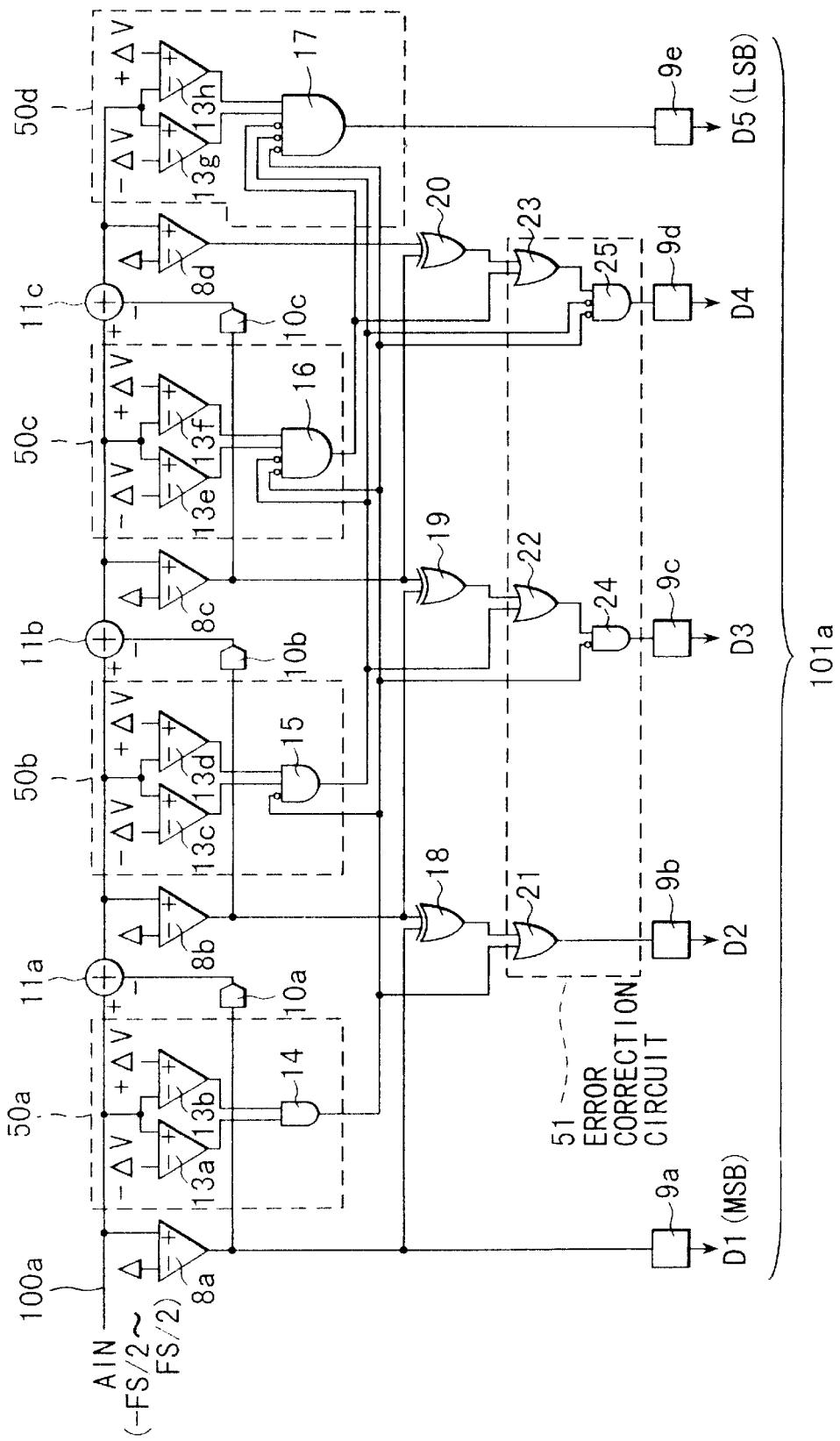
FIG. 1 is a circuit diagram depicting a conventional cascade A/D converter.
Figure 4:
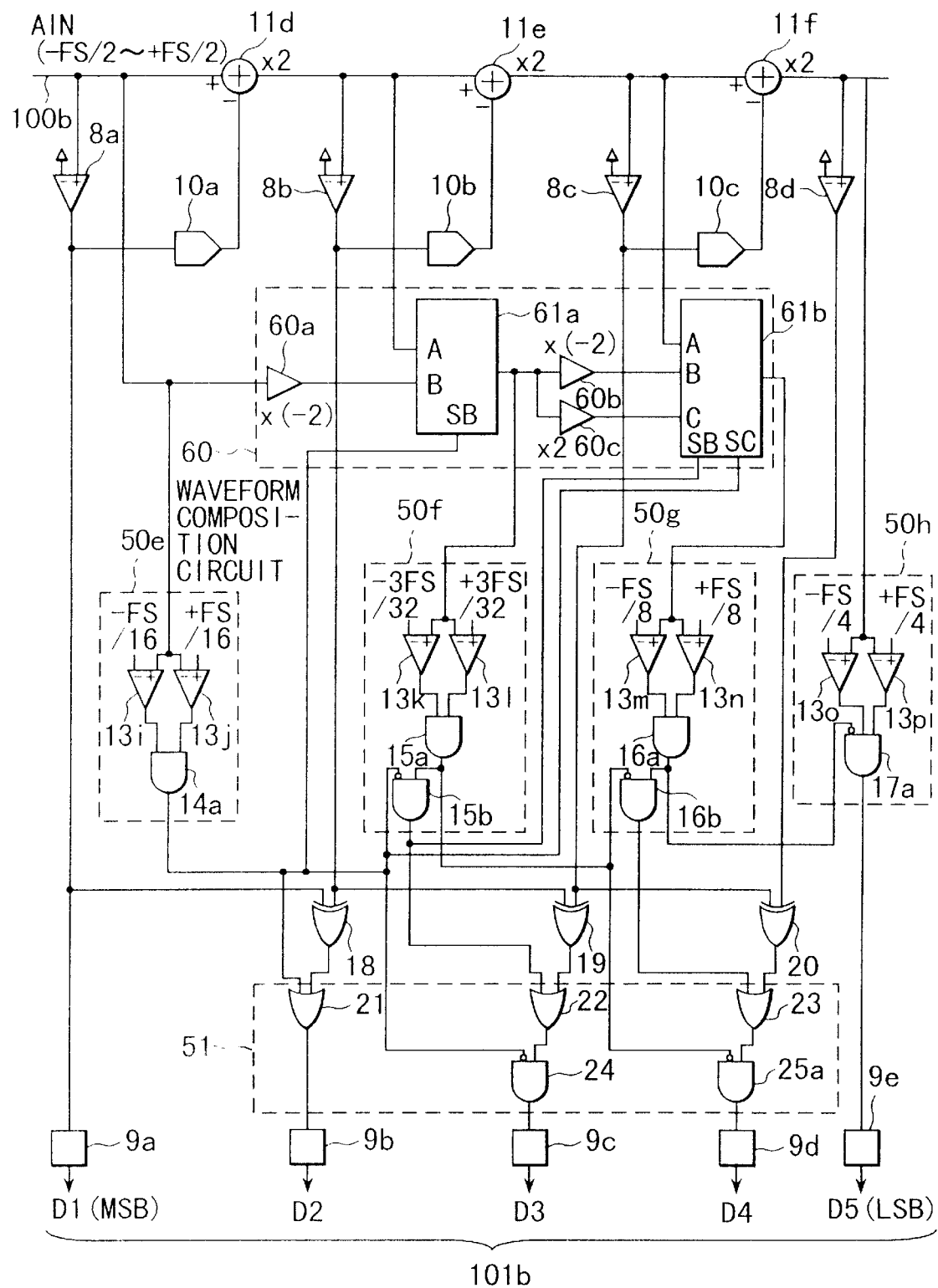
FIG. 4 is a circuit diagram depicting a first illustrative embodiment of the invention.

FIG. 4 shows a first illustrative embodiment wherein the components and identifying symbols identical to those in FIG. 1 are not discussed hereat for sake of clarity of discussion. The embodiment comprises subtactors 11d–11f; comparators 13a–13p; AND circuits 14a,15a,15b,16a, 16b, 17a and 25a; amplifiers 60a–60c; and analog multiplexers 61a,61b. Analog input signal 100b and digital output signal 101b are used. Comparators 13i and 13j and AND circuit 14a comprise window comparator 50e. Comparators 13k and 13l and AND circuit 15a,15b comprise window comparator 50f. Comparators 13m,13n and AND circuits 16a, 16b comprise window comparator 50g, Comparators 13o, and 13p and AND circuit 17a comprise window comparator 50h. The window comparators 50e,50f, 50g and 50h act to detect each vicinity of code changing points. Amplifiers 60a–60c and analog multiplexer 61a and 61b comprise waveform composition circuit 60.

The connections of the various components are basically the same as those in FIG. 1 with the following differences. Subtractors 11d–11f are provided in place of subtractors 11a–11c and outputs each resulting output signal after amplifying twice the subtraction results, respectively.

Analog input signal 100b is applied to the non-inverted input terminals of comparators 8a and 13i, the inverted input terminal of comparator 13j, the addition input terminal of subtractor 11d, and amplifier 60a. The output terminals of comparators 13i and 13j are connected to the input terminals of AND circuit 14a, respectively. The output terminal of AND circuit 14a is connected to one input terminal of OR circuit 21, negative logic input terminal of AND circuits 15b and 24, the selection terminal SB of analog multiplexer 61a, and one selection terminal SC of analog multiplexer 61b. The output terminal of amplifier 60a is connected to one input terminal eg B of analog multiplexer 61a.

The output terminal of subtractor 11d is connected to the non-inverted terminal of comparator 8b, addition input terminal of subtractor 11e, and the other input terminal, eg A, of analog multiplexer 61a. The output terminal of analog multiplexer 61a is connected to the non-inverted input terminal of comparator 13k, the inverted input terminal of comparator 13l, and amplifiers 60b and 60c, respectively. The output terminal of comparators 13k and 13l are connected to AND circuit 15a, respectively. The output terminal of AND circuit 15a is connected to the positive logic input terminal of AND circuit 15b and the negative logic input terminals of AND circuits 16b and 25a. The output terminal of AND circuit 15b is connected to one input terminal of OR circuit 22 and the other selection terminal SB of analog multiplexer 61b. The output terminal of OR circuit 23 is connected to the positive logic input terminal of AND circuit 25a. The output terminal of AND circuit 25a is connected to latch circuit 9d. The output terminals of amplifiers 60b and 60c are connected to the input terminals B,C of analog multiplexer 61b, respectively.

The output terminal of subtractor 11e is connected to the non-inverted input terminal of comparator 8c, the addition input terminal of subtractor 11f, and the input terminal A of analog multiplexer 61b. The output terminal of analog multiplexer 61b is connected to the noninverted input terminal of comparator 13m and the inverted input terminal of comparator 13n. The output terminals of comparators 13m and 13n are connected to the input terminals of AND circuit 16a, respectively. The output terminal of AND circuit 16a is connected to the positive logic input terminal of AND circuit 16b and the negative logic input terminal of AND circuit 17a. The output terminal of AND circuit 16b is connected to one input terminal of OR circuit 23. The output terminal of subtractor 11f is connected to the non-inverted input terminals of comparators 8d and 13o and the inverted input terminal of comparator 13p. The output terminals of comparators 13o and 13p are connected to the other two positive logic input terminals of AND circuit 17a, respectively. The output terminal of AND circuit 17a is connected to latch circuit 9e. The output signals from latch circuits 9a–9e are provided as digital signal 10b.

Voltages of +FS/16, +3FS/32, +FS/8, and +FS/4 are applied to the non-inverted input terminals of comparators 13j, 13l, 13n, and 13p, respectively. Also, voltages of −FS/16, −3FS/32, −FS/8 and −FS/4 are applied to the inverted input terminals of comparators 13i, 13k, 13m and 13o, respectively.

The operation of the embodiment of FIG. 4 will now be described with reference to FIGS. 5 and 6, wherein line (a) shows analog input signal 100b from −FS/2 to +FS/2; line (b) shows output of AND circuit 14a; line (c) shows the output of subtractor 11d; line (d) shows the output of amplifier 60a; and line (e) shows the output of analog multiplexer 61a. Lines (f) and (g) show the outputs of AND circuits 15a and 15b, respectively; line (h) shows the output of subtractor 11e; lines (i) and (j) show the outputs of amplifiers 60b and 60c, respectivley; line (k) shows the output of analog multiplexer 61b; lines (l) and (m) show the outputs of AND circuits 16a and 16b, respectively; line (n) shows the output of subtractor 11f; and line (o) shows the output of AND circuit 17a.

Comparator 8a judges the zero crossings of analog input signal 100b and outputs the result thereof to latch circuit 9a, D/A converter 10a, and EOR circuit 18. The D/A converter converts the output signal from comparator 8a into an analog signal and outputs the resulting signal to subtractor 11d. Subtractor 11d subtracts the output signal from D/A converter 10a from the analog input signal 100b, and then outputs the resulting output signal obtained by amplifying twice the subtraction result (see "X2" on right of subtractor 11d–11f in FIG. 4, which represents the amplifying function.

Figure 5:
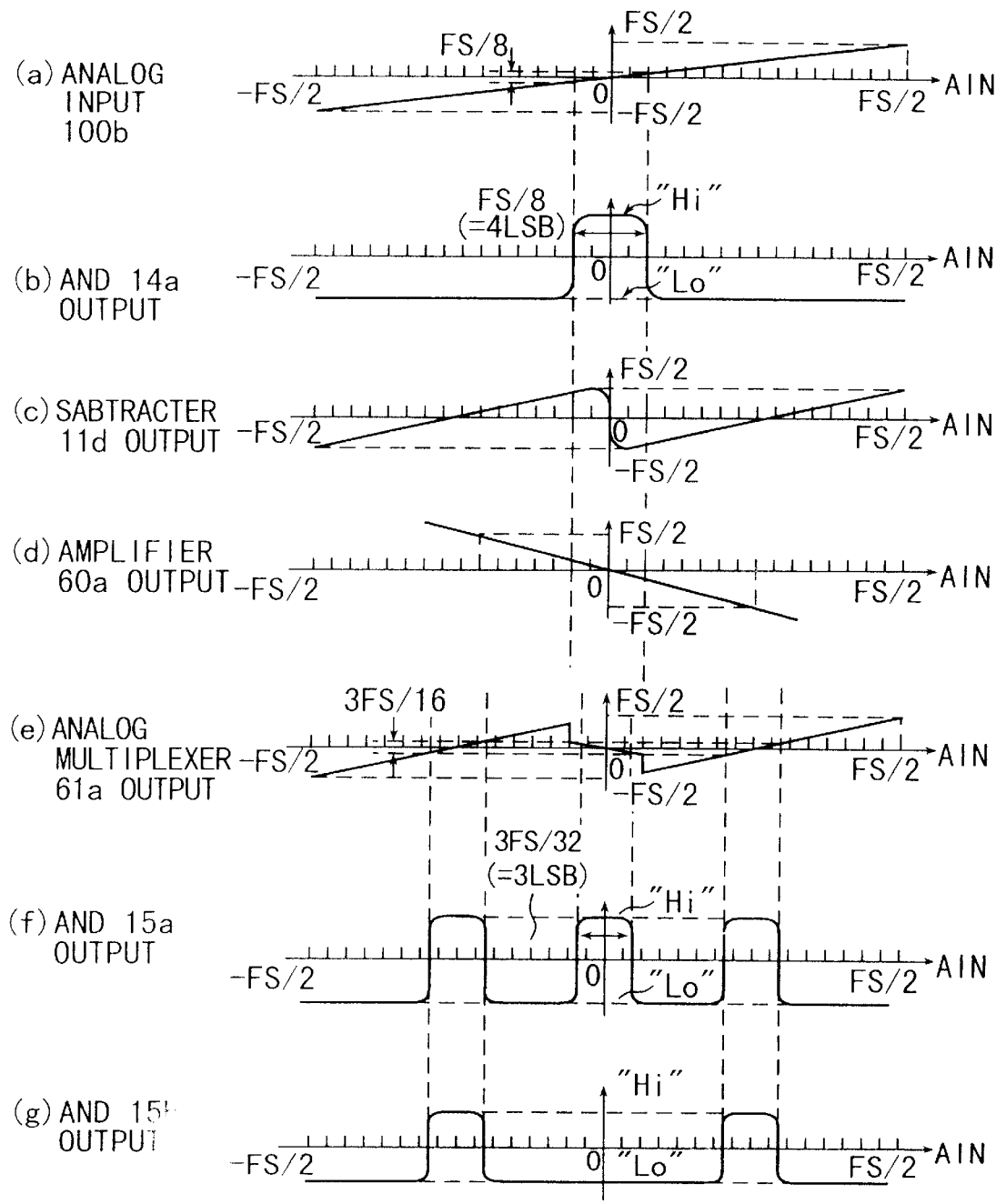
FIG. 5, comprising lines (a)–(g), is a diagram depicting characteristic curves illustrating operation of the embodiment of FIG. 4

As shown in line (b) of FIG. 5, window comparator 50e outputs a "high level" signal in window width of FS/8 in each vicinity of "zero" of analog input signal 100b, as shown in line (a) of FIG. 5.

Comparator 8b judges the zero crossing of the output signal from subtractor 11d and outputs the judged result to D/A converter 10b and EOR circuits 18,19. D/A converter 10b converts the output signal from comparator 8b into an analog signal and outputs the resulting signal to subtractor 11e. Subtractor 11e subtracts the output signal from D/A converter 10b from the output signal form subtractor 11d and outputs the resulting output signal obtained by amplifying twice the subtractraction results.

Analog multiplexer 61a multiplexes the signal obtained by amplifying analog input signal 100b by a factor of (−2) with amplifier 60a and the output signal from subtactor 11d. More specifically, analog multiplexer 61a selects the output signal from amplifier 60a shown in line (d) of FIG. 5 at the interval where the output of window comparator 50e (comprising AND circuit 14a) is at a "high level"; and selects the output signal from subtractor 11d shown in 11e (c) of FIG. 5 at the interval where the output signal from window comparator 50e is at a "low level"; and creates the code changing waveform shown in line (e) of FIG. 5; and provides an output signal to window comparator 50f.

As shown in line (f) of FIG. 5, window comparator 50f outputs "high level" signals in the window width of 3FS/32 in each vicinity of "zero" of the input signal from AND circuit 15a. As shown in line (g) of FIG. 5, window comparator 50f also outputs "high level" signals in the window width of 3FS/32 in each vicinity of "zero" of the input signal from AND circuit 15b except the interval where the output signal from window comparator 50e is at a "high level".

Comparator 8c judges the zero crossing of the output signal from subtractor 11e and outputs the judged results to D/A converter 10c, and EOR circuits 19 and 20. D/A converter 10c converts the output signal from comparator 8c into an analog signal and outputs the resulting signal to subtractor 11f. Subtractor 11f subtracts the output signal from D/A converter 10c from the output signal from subtractor 11e and provides the resulting output signal obtained by amplifying twice the subtraction results.

Analog multiplexer 61b multiplexes the signals obtained by amplifying the output signal from analog multiplexer 61a by factors of (−2) and (+2) with amplifiers 60b and 60c, respectively, and the output signals from subtractor 11e. More specifically, analog multiplexer 61b selects the output signal from amplifier 60b shown in line (i) of FIG. 6 at the interval where the output signal from AND circuit 15b in window comparator 50f is at a "high level"; selects the output signal from amplifier 60c shown in line (j) of FIG. 6 at the interval where the output signal from window comparator 50e is at a "high level"; selects the output signal from subtractor 11e shown in line (h) of FIG. 6 at the interval where both output signals from window comparators 50e and 50f are at a "low level"; creates the code changing waveform shown in line (k) of FIG. 6; and provides the resulting output signal to window comparator 50g.

Figure 6:
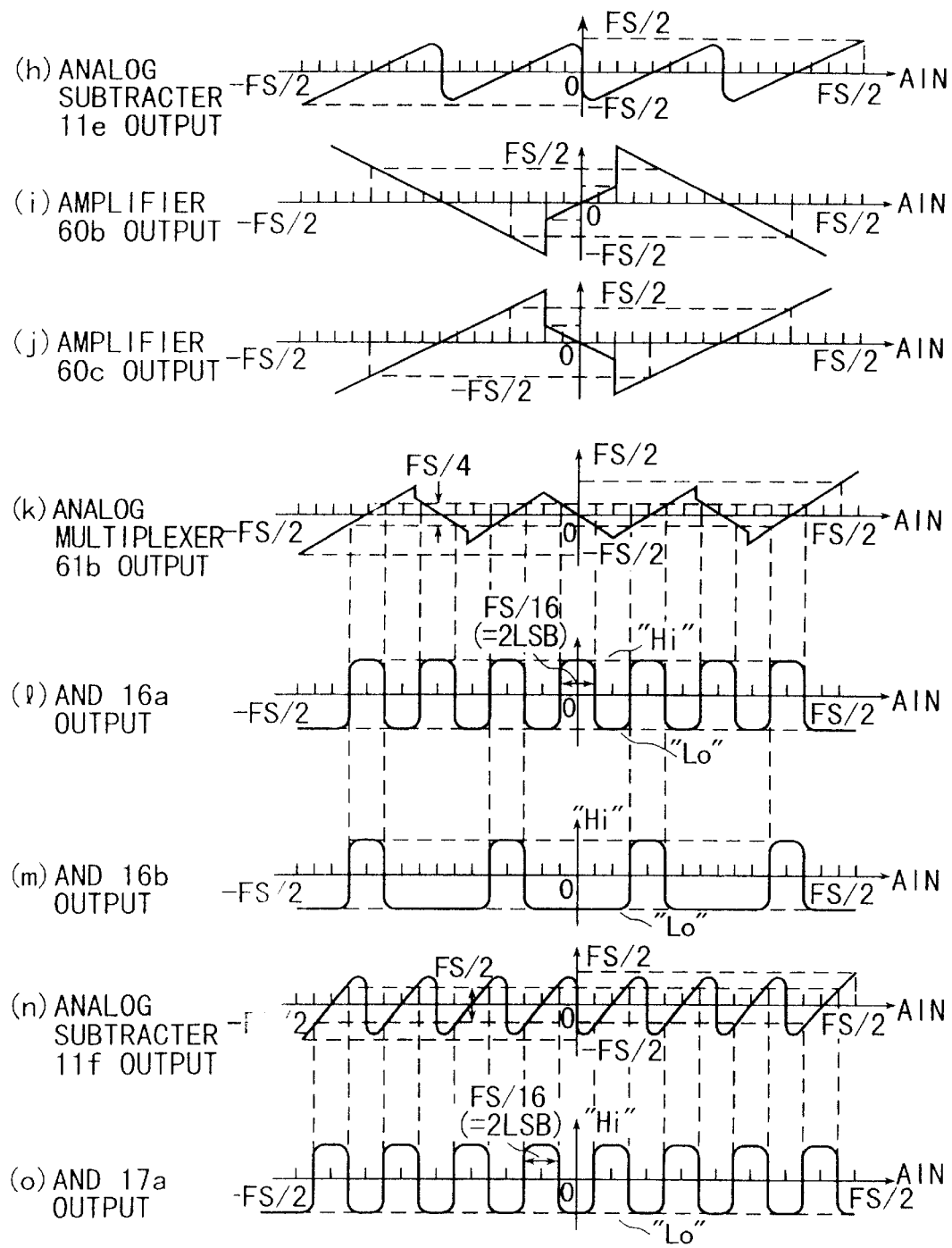
FIG. 6, comprising lines (h)–(o), is a diagram depicting characteristic curves illustrating operation of the embodiment of FIG. 4.

As shown in line (l) of FIG. 6, window comparator 50g outputs "high level" signals from AND circuit 16a in the window width of FS/16 in each vicinity of "zero" of the input signal. As shown in line (m) of FIG. 6, window comparator 50g also outputs "high level" signals from AND circuit 16b in the window width of FS/16 in each vicinity of "zero" of the input signal except the interval where the output of AND circuit 15a in window comparator 50f is at a "high level" Comparator 8d judges the zero crossing of the outuput signal from subtractor 11f and outputs the resulting singal to EOR circuit 20.

As shown in line (o) of FIG. 6, window comparator 50h, comprising AND circuit 17a, outputs a "high level" signal in the window width of FS/16 in each vicinity of "zero" of the input signal shown in line (n) of FIG. 6. Then, similar to the conventional apparatus, EOR circuits 18–20 output "gray" codes including the spike like noise of the intermediate bits in the digital output signal 101b.

Error correction circuit 51 eliminates the spike like noise in the "gray" codes by correcting the portions where the spike like noise is generated using the output signals from the window comparators.

As discussed above, the code changing waveforms are created to include the code changes at the previous stages in the waveform composition circuit 60. Thus, the window widths, i.e. the widths detecting each vicinity of code changing points, of window comparators 50e–50h can, advantageously, be set freely to increase the window widths for the upper bits and, hence, increase accuracy. Advantageously, the voltage accuracy at later stages can be made less restrictive by increasing the gains of subtractors 11d–11f and amplifiers 60a–60, by factors of two or more. Moreover, advantageously, the circuits are considerably simplified by the invention.

Second Illustrative Embodiment

Figure 7:
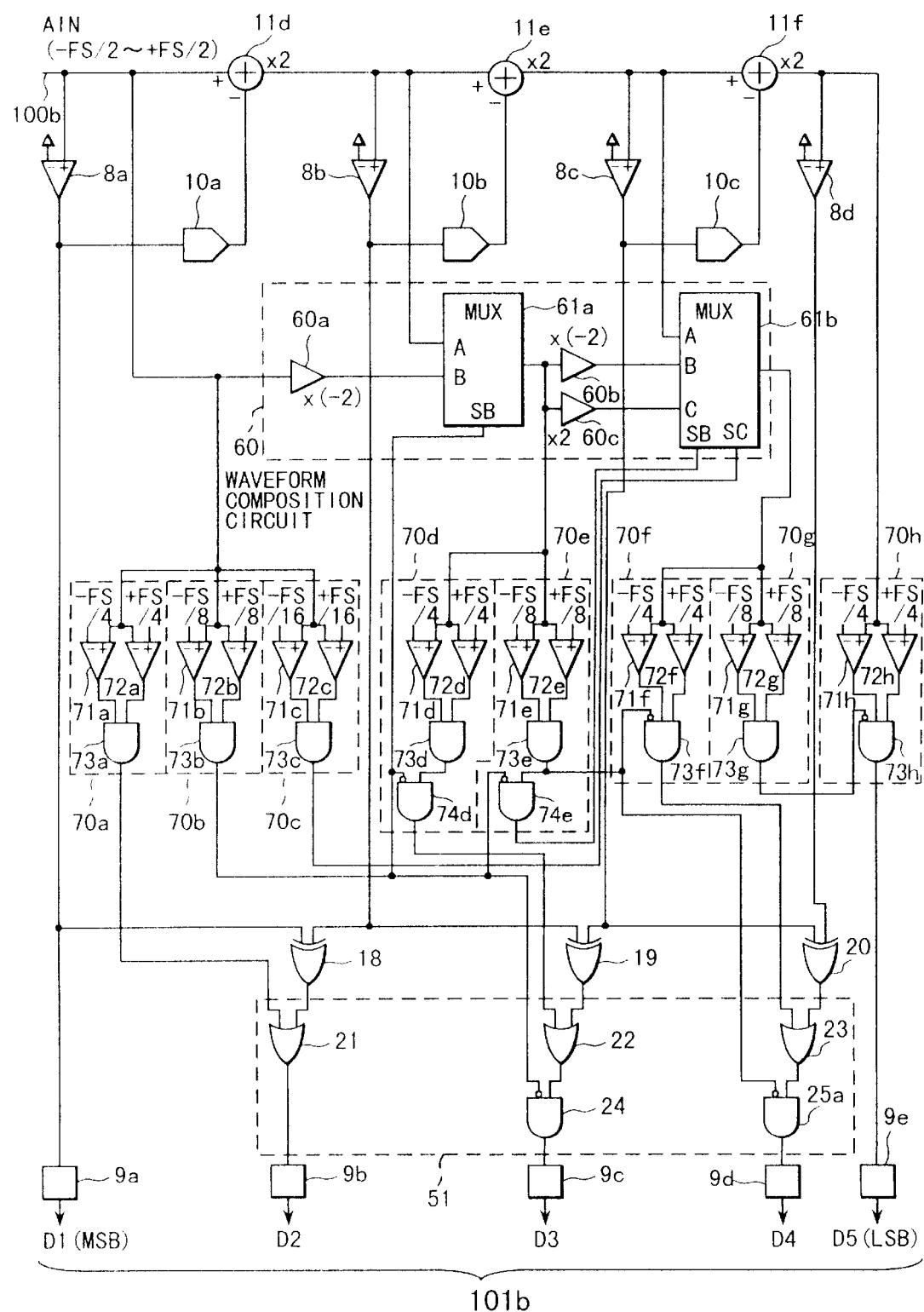
FIG. 7 is a circuit diagram depicting a second illustrative embodiment of the invention.

In FIG. 7, components and identifying symbols identical to those in FIGS. 1 and 4 are omitted from discussion for sake of clarity. FIG. 7 shows an embodiment comprising comparators 71a–71h and 72a–72h; and log-AND circuits 25a, 73a–73h, 74d, and 74e. comparators 71a,72a and AND circuit 73a comprise window comparator 70a. Comparators 71b,72b and AND circuit 73b comprise window comparator 70b. Comparators 71c,72c and AND circuit 73c comprise comparator 70c. Comparators 71d and 72d and AND circuits 73d and 74d comprise window comparator 70d. Comparators 71e and 72e and AND circuits 73e and 74e comprise window comparator 703. Comparators 71f and 72f and AND circuit 73f comprise window comparator 70f. Comparator 71g and 72g and AND circuit 73g comprise window comparator 70g. Comparators 71h and 72h and AND circuit 73h comprise window comparator 70h. The window comparators 70a–70h comprise means for detecting each vicinity of the code changing points.

The connections for the components are substantially the same as those in FIG. 1, except for the following differences. Subtractors 11d–11f are provided in place of subtractors 11a–11c and provide output signals which are obtained by amplifying by a factor of for example two the subtraction results, respectively. Analog input signal 100b is applied to the non-inverted input terminals of comparators 8a and 71a–71c, the inverted input terminals of comparators 72a–72c, the addition input terminal of subtractor 11d, and amplifier 60a.

The output terminals of comparators 71a and 72a are connected to the input terminals of AND circuit 73a, respectively. The output terminal of AND circuit 73a is connected to one input terminal of OR circuit 21. The output terminals of comparators 71b and 72b are connected to the input terminals of AND circuit 73b, respectively. The output terminal of AND circuit 73b is connected to the negative logic input terminals of AND circuits 24,74d and 74e, and the selection terminal SB of analog multiplexer 61a. The output terminal of comparators 71c and 72c are connected to the input terminals of AND circuit 73c, respectively. The output terminal of AND circuit 73c is connected to one selection terminal, e.g. SC, of analog multiplexer 61b. The output terminal of amplifier 60a is connected to one input terminal, eg B, of analog multiplexer 61a.

The output terminal of subtractor 11d is connected to the noninverted input terminal of comparator 8b, the addition input terminal of subtractor 11e, and the other input terminal, e.g. A, of analog multiplexer 61a. The output terminal of analog multiplexer 61a is connected to the non-inverted input terminals of comparators 71d and 71e, the inverted input terminals of comparators 72d and 72e, and amplifiers 60b and 60c.

The output terminals of comparators 71d and 72d are connected to the input terminals of AND circuit 73d, respectively. The output terminal of AND circuit 73d is connected to the positive logic input terminal of AND circuit 74d. The output terminal of AND circuit 74d is connected to one input terminal of OR circuit 22. The output terminals of comparators 71e and 72e are connected to the input terminals of AND circuit 73e, respectively. The output terminal of AND circuit 73e is connected to the positive logic input terminal of AND circuit 74e and the negative logic input terminals of AND circuits 25a and 73f. The output terminal of AND circuit 74e is connected to the other selection terminal e.g. SB, of analog multiplexer 61b. The output terminal of OR circuit is connected to the positive logic input terinal of AND circuit 25a. The output terminal of AND circuit 25a is connected to latch circuit 9d.

The output terminals of amplifiers 60b and 60c are connected to each input terminal B,C of analog multiplexer 61b, respectively. The output terminal of subtractor 11e is connected to the non-inverted input terminal of comparator 8c, the addition input terminal of subtractor 11f, and one input terinal, e.g. 1A, of analog multiplexer 61b. The output terminal of analog multiplexer 61b is connected to the non-inverted input terminals of comparators 71f and 71g and to the inverted input terminals of comparators 72f and 72g.

The output terminal of comparators 71f and 72f are connected to each positive logic input terminal of AND circuit 73f, respectively. The output terminal of AND circuit 73f is connected to one input terminal of OR circuit 23. The output terminal of comparators 71g and 72g are connected to each input terminal of AND circuit 73g, respectively. The output terminal of AND circuit 73g is connected to the negative logic input terminal of AND circuit 73h. The output terminal of subtractor 11f is connected to the non-inverted input terminals of comparators 8d and 71h and the inverted input terminal of comparator 72h. The output terminal of comparators 71h and 72h are connected to each positive logic input terminal of AND circuit 73h. The output terminal of AND circuit 73h is connected to latch circuit 9e.

The output signals from latch circuits 9a–9e are provided as digital signals 101b. Voltages of +FS/4, +FS/8, +FS/16, +FS/4, +FS/8, +FS/4, +FS/8 and +FS/4 are applied to the non-inverted input terminals of comparators 72a–72h, respectively. Also, voltages of −FS/4, −FS/8, −FS/16, −FS/4, −FS/8, −FS/4, −FS/8, and −FS/4 are applied to the inverted input terminals of comparators 71a–71h, respectively.

The operation of the embodiment of FIG. 7, will now be described with reference to FIGS. 8–11, wherein in FIG. 8, line (a)shows analog input signal 100b from −FS/2 to +FS/2, line (b) shows the output of comparator 8a, line (c) shows the output of subtractor 11d, line (d) shows the output fo comparator 8b, line (e) shows the output of subtractor 11e, and line (f) shows the output of comparator 8c; in FIG. 9, dline (g) shows the output of subtractor 11f, line (h) shows the output of comparator 8d, and liens (i)–(k) show the outputs of AND circuits 73a–73c, resepctively; in FIG. 10, line (l) shows the output of analog multiplexer 61a, lines (m) and (o) show the outputs of AND circuits 74d, 73e and 74e, respectively, line (p) show the output of analog multiplexer 61b, and lines (q)–(r) show the outputs of AND circuits 73f and73g; and in FIG. 11, line (s) shows the output of AND circuit 73h, line (t) shows the output of OR circuit 21, and lines (u) and (v) show the outputs of AND circuits 24 and 25a, respectively.

Comparator 82 judges the zero crossing of analog input signal lOOb and supplies the judged result to latch circuit 9a, D/A converter 10a, and EOR circuit 18. D/A converter 10a converts the output signal from comparator 8a into an analog signal and outputs the resulting signal to subtractor 11d. Subtractor 11d subtracts the ouput signal from D/A converter 10a from analog input signal 100b and provides the resulting output signal obtained by multiplying, by a factor for example of two, the subtraction results.

Figure 8:
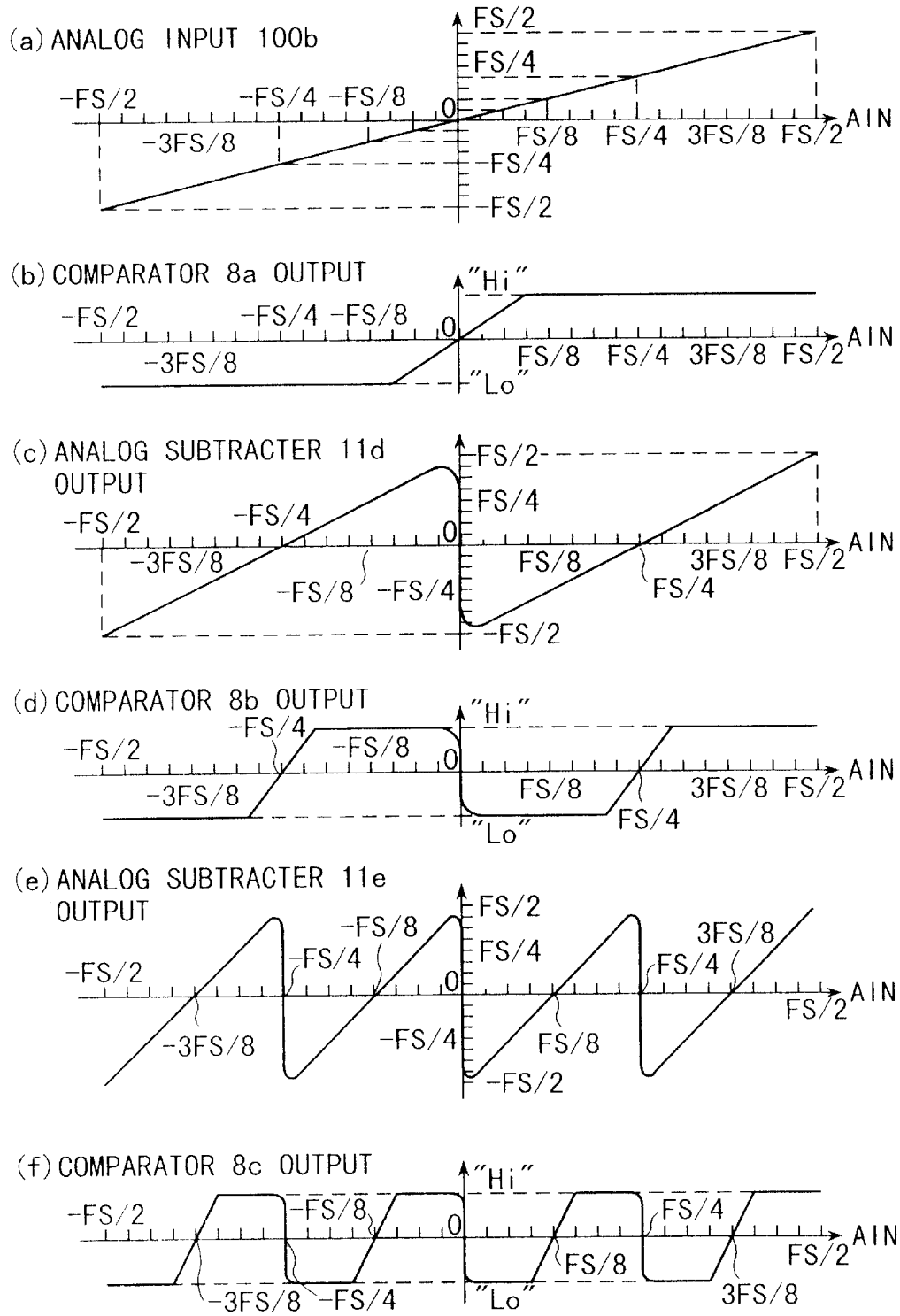
FIG. 8, comprising lines (a)–(f), is a diagram depicting characteristic curves illustrating operation of the embodiment of FIG. 7.

As shown in line (i) of FIG. 9, window comparator 70a outputs a "high level" signal in the window width of FS/2 in each vicinity of "zero" of analog input signal 100b shown in line (a) of FIG. 8. The output signal from AND circuit 73a is used for rejecting spike like noise in the second bit from the MSB. As shown in line (j) of FIG. 9, window comparator 70b outputs a "high level" signal in the window width of FS/4 in each vicinity of "zero" of analog input signal lOOb shown in line (a) of FIG. 8. The output signal from AND circuit 73b is used for rejecting spike like noise in the third bit from the MSB. As shown in line (k) of FIG. 9, window comparator 70c outputs a "high level" signal in the window width of FS/8 in each vicinity of "zero" of analog input signal 100b shown in line (a) of FIG. 8.

Comparator 8b judges the zero crossing of the output signal from subtractor 11d and supplies the resulting output signal to D/A converter 10b and EOR circuits 18 and 19. D/A converter 10b converts the output signal from comparator 8b into an analog signal and then supplies the analog signal to the subtractor 11e. Subtractor 11e subtracts the output signal from the D/A converter from the outut signal from subtractor 11d and provides the resulting output signal obtained by amplifying by a factor for example of two the subtraction result. Analog multiplexer 61a multiplexes the signal obtained by amplifying analog input signal 100b by a factor of (−2) with amplifier 60a and the output signal from the subtractor lid. More specifically, analog multiplexer 61a selects the output signal from amplifier 60a at the interval where the output signal from window comparator 70b, comprising AND circuit 73b, is at a "high level"; selects the output signal from subtractor lid, shown in line (c) of FIG. 8, at the interval where the output signal from window comparator 70b is at a "low level"; creates the code changing waveform shown in line (l) of FIG. 10; and supplies the output signal to window comparators 70d and 70e. Window comparator 70d outputs a "high level" signal from AND circuit 73e in the window width of FS/4 in each vicinity of "zero" of the input signal. That is, as shown in line (l) of FIG. 10, the "high level" signal is obtained in the window width from −3FS/8 to +3FS/8. As shown in line (m) of FIG. 10,AND circuit 74d outputs "high level" signals in the window width of FS/4 in each vicinity of "zero" of the input signal except the interval where the output of window comparator 70b is at a "high level". The output signal from AND circuit 74d is used to eliminate the spike like noise in the third bit from the MSB.

Figure 10:
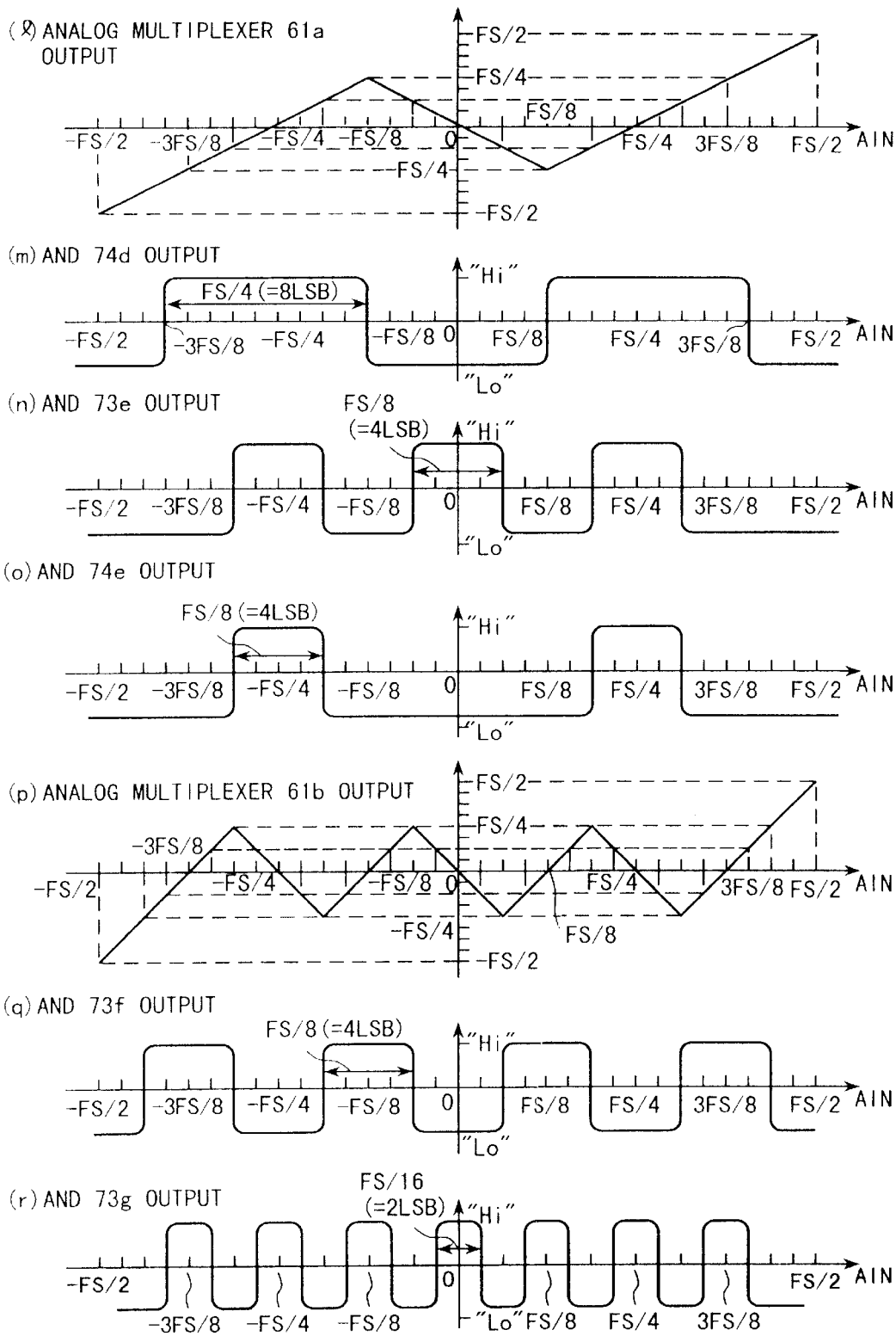
FIG. 10, comprising lines (l)–(r), is a diagram depicting characteristic curves illustrating operation of the embodiment of FIG. 7.
Figure 11:
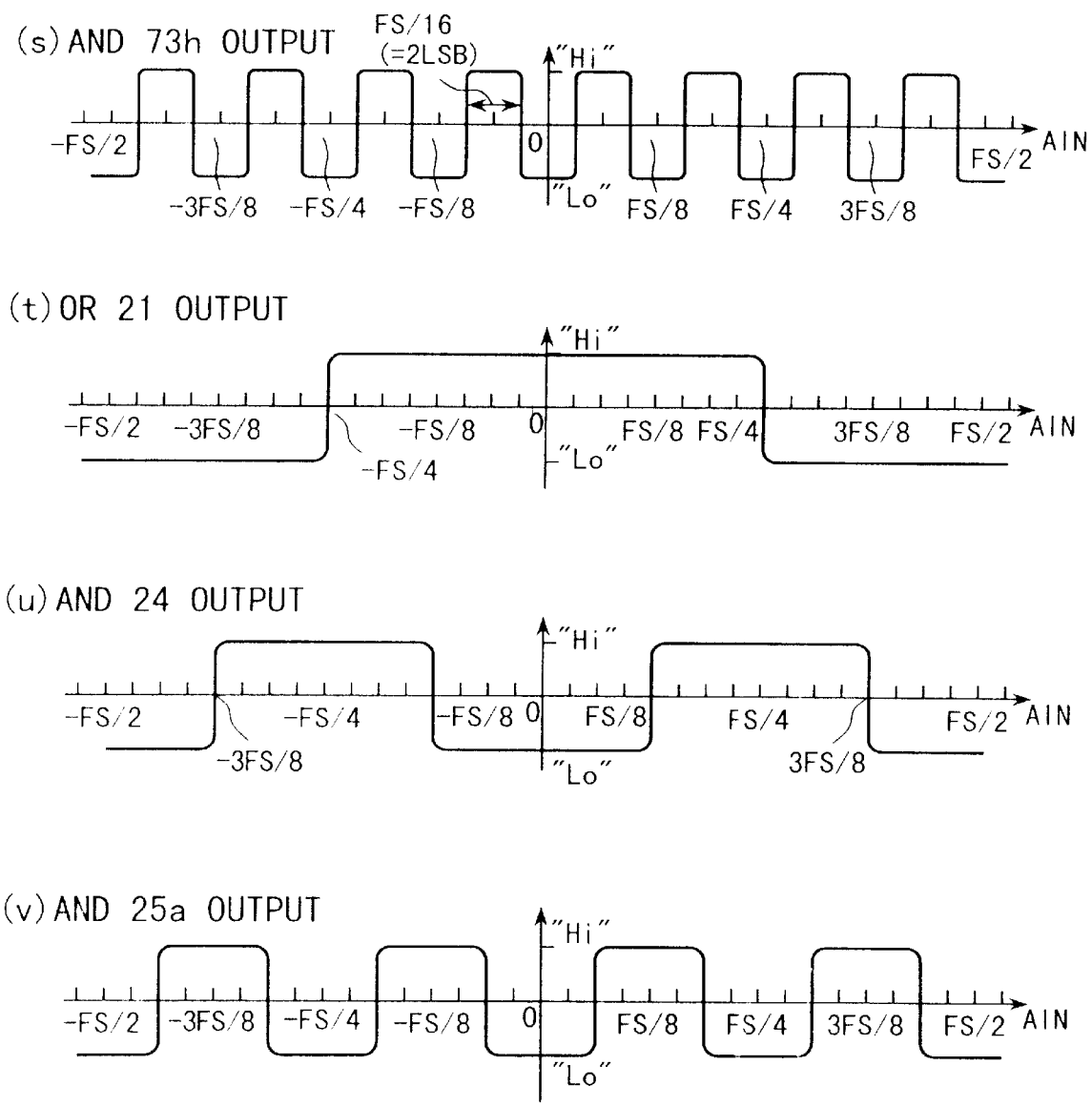
FIG. 11, comprising lines (s)–(v), is a diagram depicting characteristic curves illustrating operation of the embodiment of FIG. 7.

As shown in line (n) of FIG. 10, window comparator 70e outputs a "high level" signal from the AND circuit 73e in the window width of FS/8 in each vicinity of "zero" of the input signal. As shown in line (o) of FIG. 10, AND circuit 74e outputs "high level" signals in the window width of FS/8 in each vicinity of "zero" of the input signal except the interval where the outut signal from window comparator 70b is at a "high level". The output signal form AND circuit 73e is used to eliminate the spike like noise in the fourth bit from the MSB.

Comparator 8c judges the zero crossing of the output signal from subtractor lie and provides the judged result to D/A converter 10c and EOR circuits 19 and 20. D/A converter converts the output signal from comparator 8c into an analog signal and supplies the analog signal to subtractor 11f. Subtractor 11f subtracts the output signal from D/A converter 10c from the output signal from subtractor lie and supplies the resulting output signal obtained by amplifying by a factor for example of two the subtraction result.

Analog multiplexer 61b multiplexes the signals obtained by amplifying the output signal from analog multiplexer 61a by factors of (−2) and (+2), respectively, with amplifiers 60b and 60c, and the output signal from subtractor lie. More specfically, analog multiplexer 61b selects the output signal from amplifier 60b at the interval where the output signal from AND circuit 74e of window comparator 70e is at a "high level"; selects the output signal from amplifier 60c at the interval where the output signal form window comparator 70c is at a "high level"; selects the output signal from subractor lie shown in line (e) of FIG. 8 at the interval where both of the window comparator output signals are at a "low level"; then creates the code changing waveform shown in line (p) of FIG. 10, and provides the resulting output signal to the input terminal of window comparators 70f and 70g.

As shown in line (q) of FIG. 10, window comparator 70f outputs "high level" signals from AND circuit 73f in the window width of FS/8 in each vicinity of "zero" of the input signal except the interval where the output signal from AND circuit 73e of window comparator 70e is at a "high level". The output signal from AND circuit 73f is used to eliminate the spike like noise in the fourth bit from the MSB. As shown in line (r) of FIG. 10, window comparator 70g outputs "high level" signals from AND cirucit 73g in the window width of FS/16 in each vicinity of "zero" of the input signal. The output signal from AND circuit 73g is used for eliminating noise in the LSB.

Comparator 8d judges the zero crossing of the output signal from subtractor 11f and supplies the results to EOR circuit 20. The output signal from window comparator 70h, which comprises AND circuit 73h, can become "high level" in 15 positions, as shown in line (g) of FIG. 9. However, sine the portions where the output signal from window comparator 70g is at a "high livel" are except from the 15 positions, the output signal from AND circuit 73h is as shown in line (s) of FIG. 11.

Figure 3:
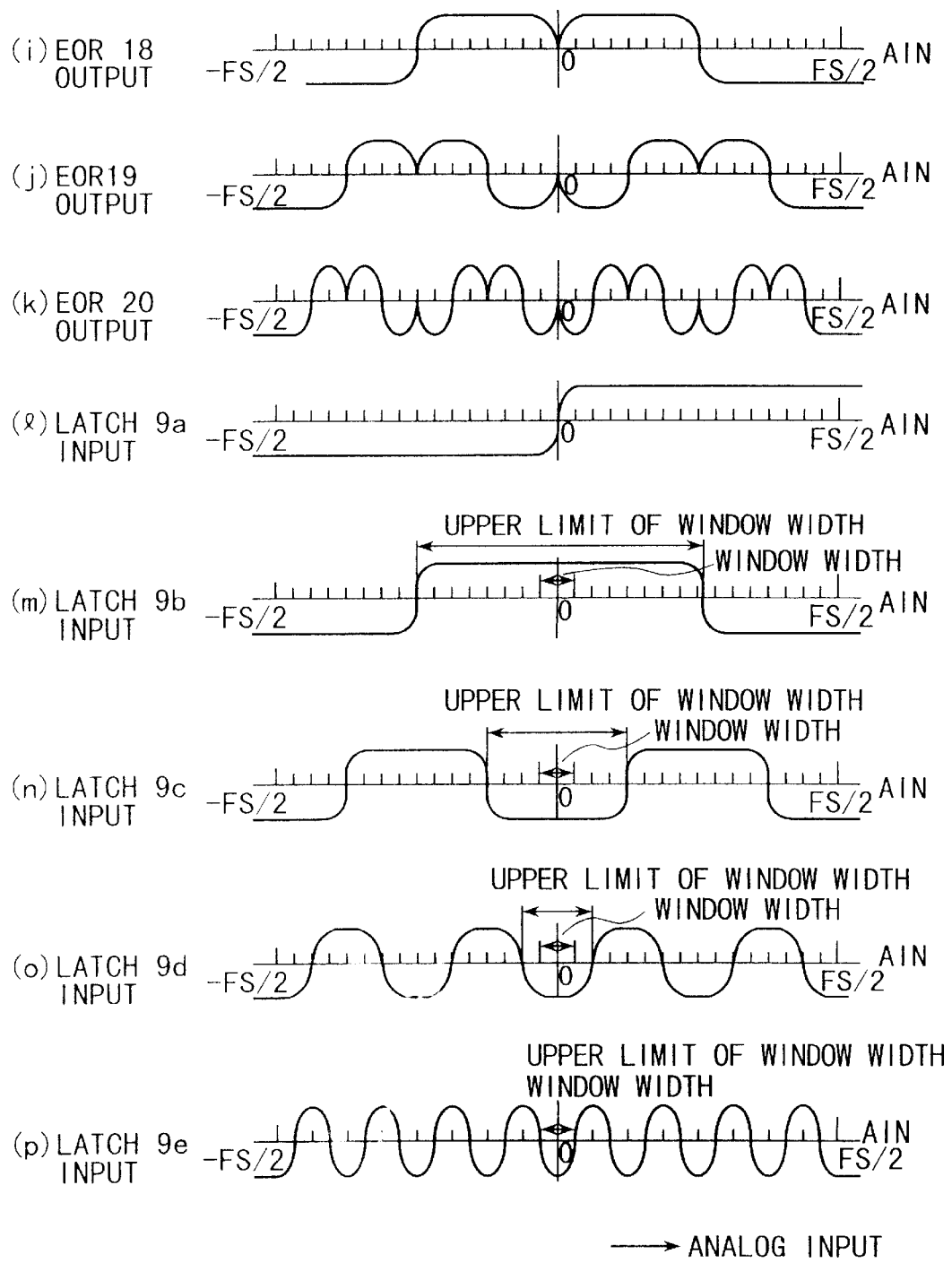
FIG. 3, comprising lines (i)–(p), is a diagram depicting characteristic curves illustrating operation of the device of FIG. 1.

Similar to the conventional devices, the output signal from EOR circuit 18–20 are "gray" codes having spike like noise of the intermediate bits within the digital output signal 101b. Error correction circuit 51 corrects the portions where the spike like noise is generated with the output signals from the window comparators to eliminate the spike like noise in "gray" codes. In other words, the spike like noise shown in line (i) of FIG. 3 is eliminated by masking the spike like noise with the output signal from the window comparator 70a. The spike like noise shown in line (j) of FIG. 3 is eliminated by being masked by the output signal from window comparators 70b and 70d. The spike like noise shown in line (k) of FIG. 3 can be eliminated by masking with the output signals from window comparators 70e and 70f, respectively.

As described above, with the embodiment the code changing waveforms are created including the code changes in the previous stages with waveform composition circuit 60. Thus, advantageously, the window widths i.e. widths for detecting each vicinity of code changing points, of window comparators 70a–70h can be set freely and wider window widths can be obtained for the upper bits. Hence, advantageously, effects due to noise are reduced and accuracy is increased.

In addition, advantageously, since window comparators 70a–70g, whose window widths are different in each stage, are provided, the window widths for eliminating noise can be made as large as possible with respect to all of the bits. That is, advantageously, effects due to noise are reduced and accuracy is increased. Moreover, advantageously, voltage accuracy at later stages is made less restrictive by increasing, by a factor of two or more, the gains of the subtractors 11d–11f and amplifiers 60a–60c; and the circuit configuration is simplified. The analog multiplexer may also include amplifier functions.

Third Illustrative Embodiment

Figure 12:
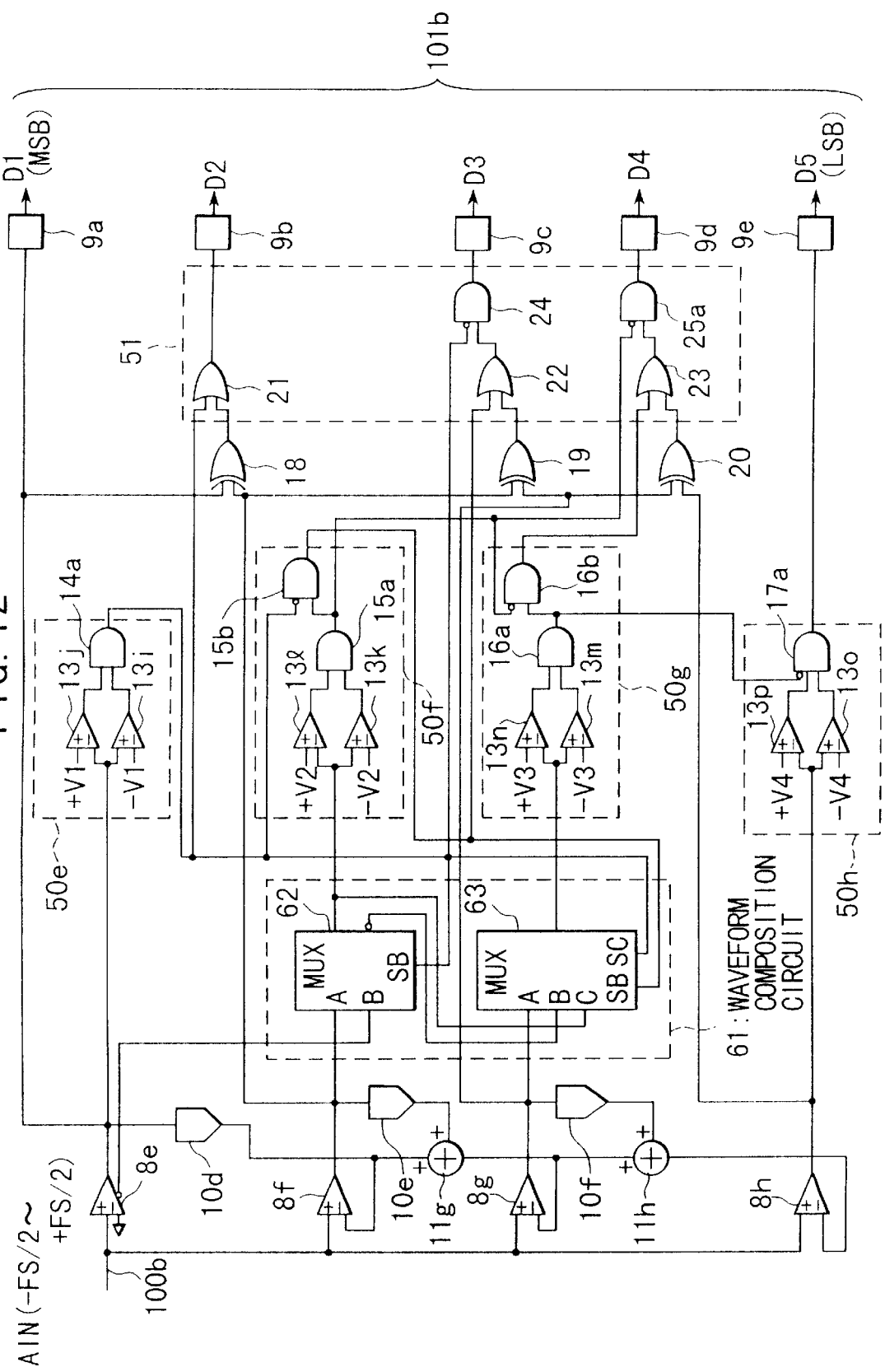
FIG. 12 is a circuit diagram depicting a third illustrative embodiment of the invention.

In FIG. 12, the components and identifying symbols identical to those shown in FIG. 1 are not described hereat for sake of clarity. The embodiment comprises comparators 8e–8h; D/A converters 10d–10f; comparators 13i–13p; AND circuits 14a,15a,15b, 16a, 16b, 17a, and 25a; and analog multiplexers 62,63. An analog input signal 100b and digital output signal 101b are provided.

Comparators 13i, 13j and AND circuit 14a comprise window comparator 50e. Comparators 13k, 13l and AND circuits 15a,15b comprise window comparator 50f. Comparators 13m and 13n and AND circuits 16a and 16b comprise comparator 50g. Comparators 13o and 13p and AND circuit 17a comprise window comparator 50h. The window comparators 50e–50h comprise means for detecting each vicinity of code changing points. Analog multiplexers 62 and 63 comprise waveform composition circuit 61.

The connections between the components which differ from those of FIG. 1 are described below. Analog input signal 100b is applied to the non-inverted input terminals of comparators 8e–8h, respectively. The positive logic output terminal of comparator 8e is connected to latch circuit 9a, D/A converter 10d, the non-inverted input terminal of comparator 13i, the inverted input terminal of comparator 13j, and one input terminal of EOR circuit 18. The negative logic output terminal of comparator 8e is connected to one input terminal, e.g. B, of analog multiplexer 62. The output terminal of D/A converter 10d is connected to the inverted input terminal of comparator 8f and one input terminal of adder 11g. In addition, each output terminal of comparators 13i and 13j is connected to the input terminals of AND circuit 14a, respectively. The output terminal of AND circuit 14a is connected to one input terminal of OR circuit 21, the negative logic input terminal of AND circuits 15b and 24, the selection terminal SB of analog multiplexer 62 and one selection terminal, e.g. SC, of analog multiplexer 63.

The output terminal of comparator 8f is connected to D/A converter 10e, the other input terminal of EOR circuit 18, one input terminal of EOR circuit 19, and the other input terminal, e.g. A, of analog multiplexer 62. The positive logic output terminal of analog multiplexer 62 is connected to the non-inverted input terminal of comparator 13k, the inverted input terminal of comparator 13l, and one input terminal, e.g. C, of analog multiplexer 63. The negative logic output terminal of analog multiplexer 62 is connected to the second input terminal e.g. B, of analog multiplexer 63. In addition, each output terminal of comparators 13k and 13l is connected to AND circuit 15a, respectively. The output terminal of AND circuit 15a is connected to the positive logic input terminal of AND circuit 15b and to the negative logic input terminals of AND circuits 16b and 25a. The output terminal of AND circuit 15b is connected to one input terminal of OR circuit 22 and the other selection terminal, e.g. SB, of analog multiplexer 63. The output terminal of OR circuit 23 is connected to the positive logic input terminal of AND circuit 25a. The output terminal of AND circuit 25a is connected to latch circuit 9d.

The output terminal of D/A converter 10e is connected to the other input terminal of adder 11g. The output terminal of adder 11g is connected to the inverted input terminal of comparator 8g and one input terminal of adder 11h. The output terminal of comparator 8g is connected to D/A converter 10f, the other input terminal of EOR circuit 19, one input terminal of EOR circuit 20, and the third input terminal, e.g. A, of analog multiplexer 63. The output terminal of analog multiplexer 63 is connected to the non-inverted input terminal of comparator 13m and the inverted input terminal of comparator 13n. Each output terminal of comparators 13m and 13n is connected to the input terminals of AND circuits 16a, respectively. The output terminal of AND circuit 16a is connected to the positive logic input terminal of AND circuit 16b and the negative logic input terminal of AND circuit 17a. The output terminal of AND circuit 16b is connected to one input terminal of OR circuit 23.

The output terminal of D/A converter 10f is connected to the other input terminal of adder 11h. The output terminal of adder 11h is connected to the inverted input terminal of comparator 8h. The output terminal of comparator 8h is connected to the non-inverted input terminal of comparator 13o, the inverted input terminal of comparator 13p, and the other input terminal of EOR circuit 20. Each outputterminal of comparators 13o and 13p is connected to the other two positive logic input terminals of AND circuit 17a, respectively. The output terminal of AND circuit 17a is connected to latch circuit 9e. Furthermore, the output signals from latch circuits 9a–9e are provided as digital output signal 101b. The inverted input terminal of comparator 8e is grounded.

Voltages of +V1, +V2, +V3, and +V4 are applied to the non-inverted input terminals of comparators 13j, 13l, 13n, and 13p, respectively. Voltages of –V, –V2, –V3, and –V4 are applied to the inverted input terminals of comparators 13i, 13k, 13m and 13o, respectively. Voltage V1 is selected to be of a value with which the window width of window comparator 50e becomes FS/8 at the differential operation interval of comparator 8e. Voltage V2 is selected to be of a value with which the window width of window comparator 50f becomes 3FS/32 at the differential operation interval of comparators 8e and 8f. Voltage V3 is selected to be of a value with which the window width of window comparator 50g becomes FS/16 at the differential operation interval of comparators 8e–8g. Voltage V4 is selected to be of a value with which the window width of window comparator 50h becomes FS/16 at the differential operation interval of comparator 8h.

The operation of the embodiment of FIG. 12 will now be described with reference to FIGS. 13–15,wherein in FIG. 13, line (a) shows analog input signal 100b of −FS/2 to +FS/2, line (b) shows the output of comparator 8e, line (c) shows the output of D/A converter 10d, line (d) shows the output of comparator 8f, line (e) shows the output of D/A converter 10e, and line (f) shows the output of adder 11g; in FIG. 14, line (g) shows the output of comparator 8g, line (h) shows the output of D/A converter 10f, line (i) shows the output of adder 11h, line (j) shows the output of comparator 8h, line (k) shows the output of AND circuit 14a, and line (l) shows the positive logic output of analog multiplexer 62; and in FIG. 15, line (m) and line (n) show the outputs of AND circuits 15a and 15b, respectively, line (o) shows the output of analog multliplexer 63, lines (p)–(r) show the outputs of AND circuits 16a, 16b, and 17a, respectively, and lines (s)–(u) show each input of latch circuits 9b to 9d, respectively.

Figure 13:
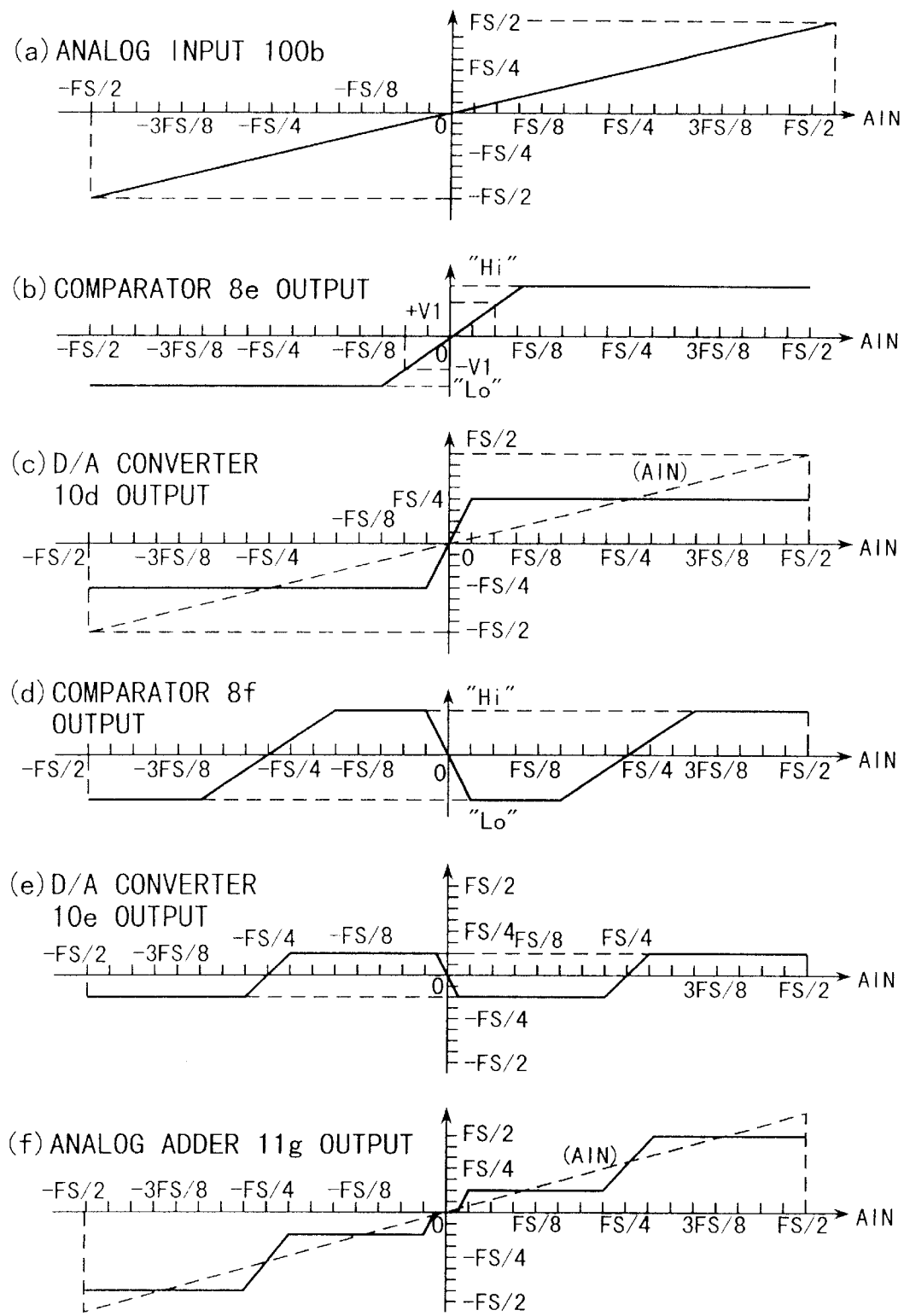
FIG. 13, comprising lines (a)–(f), is a diagram depicting characteristic curves illustrating operation of the embodiment of FIG. 12.

Comparator 8e compares the analog input signal 100b, shown in line (a) of FIG. 13, with the zero point and provides differential amplification as shown in line (b) of FIG. 13. In this case, a comparator having less gain than comparator 8a of the conventional device is used as comparator 8e. Comparator 8e provides positive logic output signal to latch circuit 9a, D/A converter 10d, comparators 13i and 13j and EOR circuit 18, and negative logic output signal to analog multiplexer 62. D/A converter 10d converts the positive logic output signal from comparator 8e into an analog signal, as shown in line (c) of FIG. 13 and provides the analog signal to comparator 8f.

Figure 14:
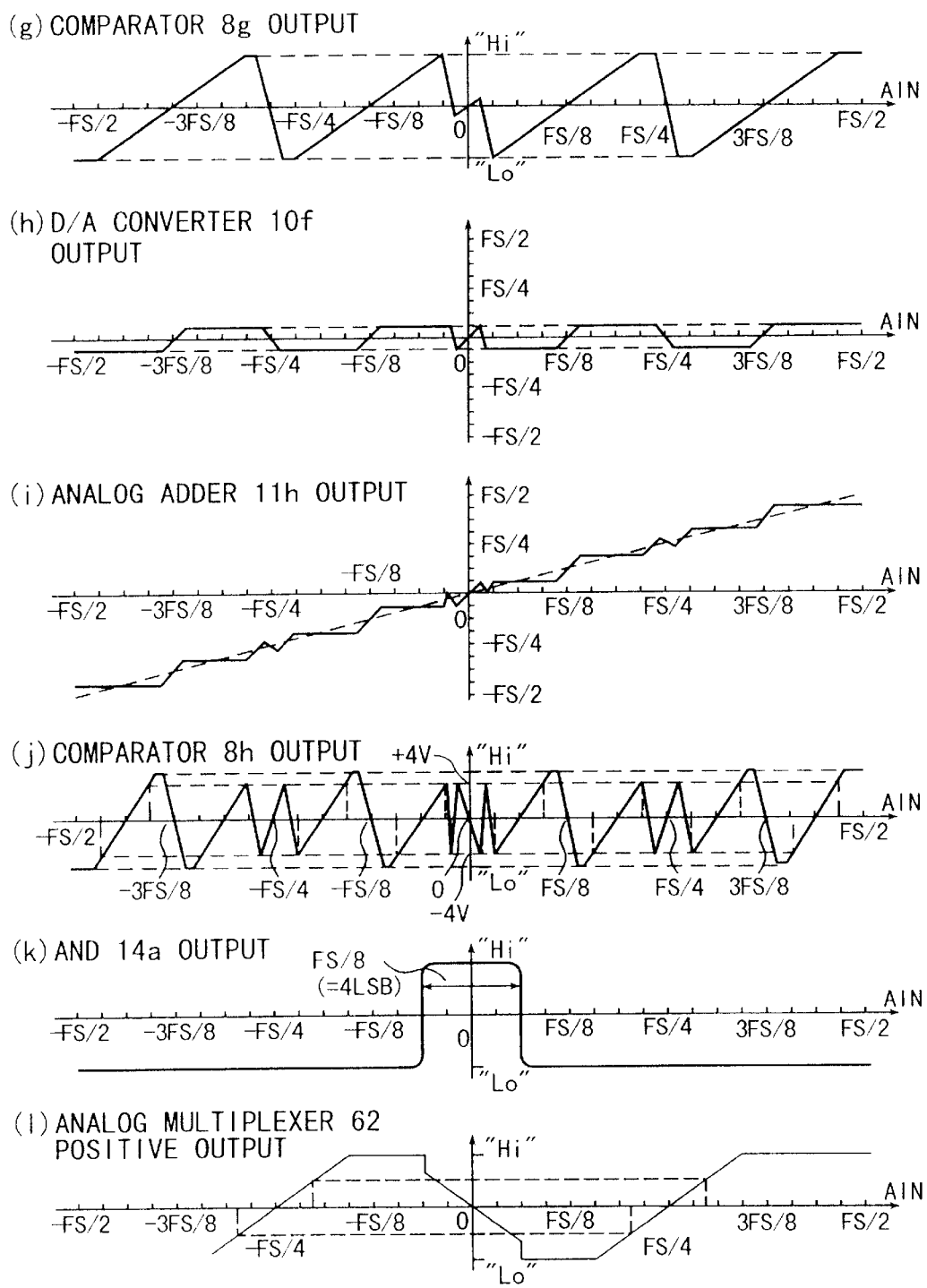
FIG. 14, comprising lines (g)–(l), is a diagram depicting characteristic curves illustrating operation of the embodiment of FIG. 12.

As shown in line (k) of FIG. 14, window comparator 50e outputs a "high level" signal in the window width of FS/8 in each vicinity of "zero" of the output signal from comparator 8e as shown in line (b) of FIG. 13. Comparator 8f compares analog input signal 100b with the output signal from the D/A converter 10d and provides differential amplification, as shown in line (d) of FIG. 13. In addition, a comparator, whose gain is smaller than that of a comparator used in conventioal devices, is used as comparator 8f. The output siganl from comparator 8f is provided to D/A converter 10e, EOR circuit 18 and 19 and analog multiplexer 62.

As shown in line (e) of FIG. 13, D/A converter 10e converts the output signal from comparator 8f into an analog signal and provides the resulting signal to adder 11g. AS shown in line (f) of FIG. 13, adder 11g adds the output signal from D/A converter 10d to the output signal from D/A converter 10e and provides the results of the addition to comparator 8g and adder 11h.

Analog multiplexer 62 multiplexes the output signals from comparators 8e and 8f. More specifically, analog multiplexer 62 selects the output signal from comparator 8e, shown in line (b) of FIG. 13, at the interval where the output signal from window comparator 50e, comprising AND circuit 14a, is at a "high level"; selects the output signal from comparator 8f, shown in line (d) of FIG. 13, at the interval where the window comparator output signal is at a "low level"; and creates the code changing waveform shown in line (l) of FIG. 14. This code changing waveform is applied to window comparator 50f and analog multiplexer 63 and the inverted output signal of the code changing waveform is also applied to analog multiplexer 63.

Figure 15:
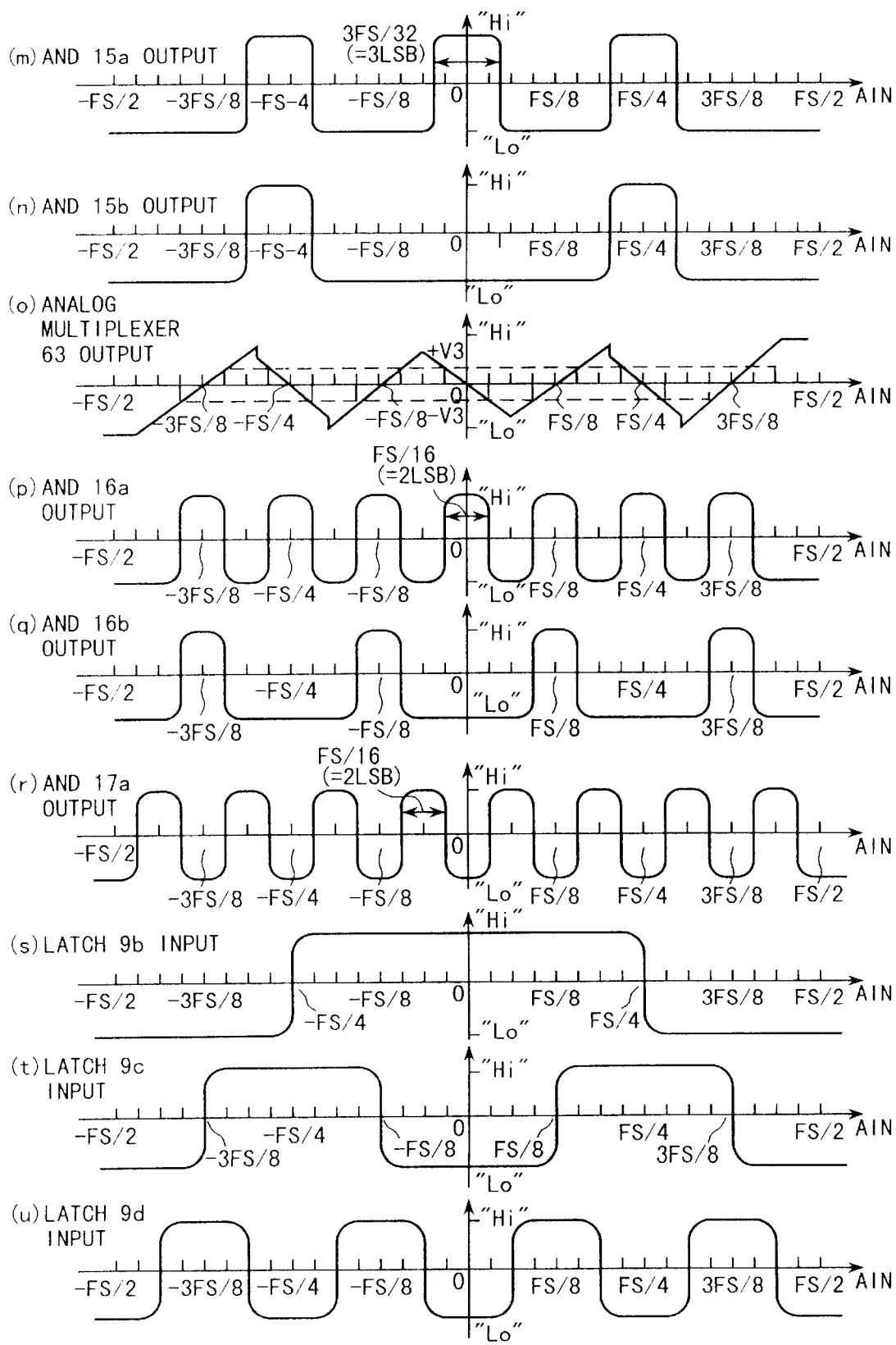
FIG. 15, comprising lines (m)–(u), is a diagram depicting characteristic curves illustrating operation of the embodiment of FIG. 12.

As shown in line (m) of FIG. 15, window comparator 50f outputs "high level" signals from AND circuit 15a in the window width of 3FS/32 in each vicinity of "zero" of the input signal. As shown in line (n) of FIG. 15, window comparator 50f outputs "high level" signals from AND circuit 15b in the window width of 3FS/32 in each vicinity of "zero" of the input signal, except the interval where the output signal from window comparator 50e is at a "high level".

Comparator 8g compares analog input signal 100b with the output signal from the adder 11g and provides differential amplification, as shown in line (g) of FIG. 14. Also, a comparator whose gain is smaller than that of the comparator used in the conventional devices is used as comparator 8g. The output signal from comparator 8g is applied to D/A converter 10f, EOR circuits 19 and 20, and analog multiplexer 63.

As shown in line (h) of FIG. 14, D/A converter 10f converts the output signal from comparator 8g into an analog signal and provides this analog signal to adder 11h. As shown in line (i) of FIG. 14, adder 11h add the output signal from D/A converter 10f to the output signal from adder 11g and provides the results of the addition to comparator 8h.

Analog multiplexer 63 multiplexes the output signal from analog multiplexer 62 and the output signal from comparator 8g. More specifically, analog multiplexer 63 selects the inverted output signal from the analog multiplexer 62 at the interval where the output signal from AND circuit 15a in window comparator 50f is at a "high level"; selects the output signal from analog multiplexer 62, as shown in line (l) of FIG. 14 at the interval where the output signal from window comparator 50e is at a "high level"; selects the output signal from comparator 8g, shown in line (g) of FIG. 14 at the interval where both of the window comparator output signals are at a "low level"; creates the code changing waveform shown in line (o) of FIG. 15; and provides the resulting output signals to window comparator 50g.

As shown in line (p) of FIG. 15, window comparator 50g outputs "high level" signals from AND circuit 16a in the window width of FS/16 in each vicinity of "zero" of the input signal. As shown in line (q) of FIG. 15, window comparator 50g outputs "high level" signals from AND circuit 16b in the window width of FS/16 in each vicinity of "zero" of the input signal, except the intervals where the output signals from AND circuit 15a in window comparator 50f is at a "hgih level".

As shown in line (j) of FIG. 14, Comparator 8h compares analog input signal 100b with the output signal from adder 11h and provides differential amplification. In addition, a comparator whose gain is smaller than that used in conventional devices is used for comparator 8h. The output signal from comparator 8h is provided to AND circuits 13o and 13p and EOR circuit 20.

As shown in line (r) of FIG. 15, window comparator 50h outputs "high level" signals in the window width of FS/16 in each vicinity of "zero" of the input signal shown in line (j) of FIG. 14. except "high level" intervals of the output signal from AND circuit 16a in window comparator 50g.

Then, similar to conventional devices, the output signal from EOR circuits 18–20 comprise "gray" codes having spike like noise of intermediate bits within the digital output signal 101b. Error correction circuit 51 corrects the portions where the spike like noise is generated using the output signal from window comparators to eliminate spike like noise in "gray" codes.

As described above, code changing waveforms are created including the code changes in the previous stages using waveform composition circuit 61. Thus, advantageously, window widths, that is the widths used for detecting each vicinity of code changing points, of window comparators 50e–50h can be set freely and wider window widths can be used for the upper bits. That is, advantageously, effects due to noise are reduced and accuracy increased. Moreover, advantageously, since the analog input signal 100b is applied directly to comparators 8e–8h, operation of subtracting the output signal from D/A converter from analog signals becomes unnecessary and hence settling is improved. Also, advantageously, subtractors are unnecessary. This reduces the scale of the circuitry and power consumption. Although adders to add output signals from the D/A converters may be used, a very simple configuration of such adders can be used with the addition performed by current addition using appropriate circuit connections only.

Fourth Illustrative Embodiment

Figure 16:
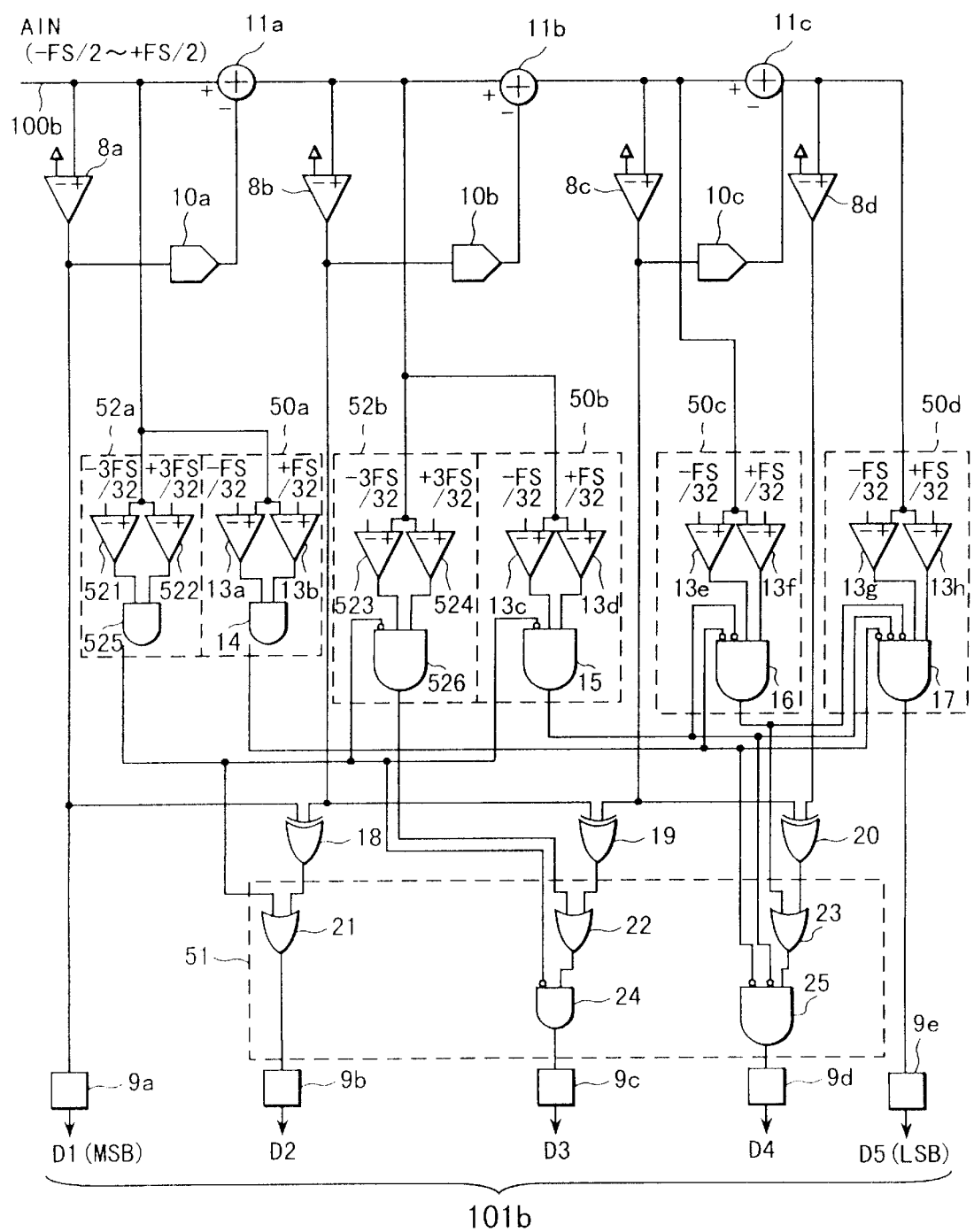
FIG. 16 is a circuit diagram depicting a fourth illustrative embodiment of the invention.

In FIG. 16, the components and identifying symbols identical to those shown in FIG. 1 will not be described hereat for sake of clarity. The embodiment comprises comparators 521–524; AND circuits 525 and 526; with provision of analog input signal 10b and digital output signal 101b. Window comparator 52a comprises comparators 521 and 522 and AND circuit 525. Window comparator 52b comprises comparators 523 and 524 and AND circuit 625. Window comparators 52a and 52b comprise means for detecting each vicinity of code changing points.

The connections of components are similar to those of the prior embodiments, except for the following differences.

Analog input signal 100b is applied to the non-inverted input terminals of comparators 8a,13a, and 521, the inverted input terminal of comparators 13b and 522, and the addition input terminal of subtractor 11a.

Each output terminal of comparators 521 and 522 is connected to the input termnals of AND circuits 525, respectively. The output terminal of AND circuit 525 is connected to one input terminal of OR circuit 21, and negative logic input terminals of AND circuits 15 and 526, in place of AND circuit 14 in the conventional device. The output terminal of AND circuit 14 is connected to the negative logic input terminals of AND circuits 16 and 17. The output terminal of subtractor 11a is connected to the non-inverted input terminal of comparator 523 and the inverted input terminal of comparator 524. Each output terminal of comparators 523 and 524 is connected to the input terminals of AND circuit 526, respectively. The output terminal of AND circuit 526 is connected to one input terminal of OR circuit 22, in place of AND circuit in the conventional device. The output terminal of AND circuit 15 is connected to the negative logic input terminals of AND circuits 16, 17 and 25. The output signals generated by latch circuits 9a–9e are outputted as a digital output signal 101b.

A voltage of +3FS/32 is applied to the non-inverted input terminals of comparators 522 and 524. A voltage of −3FS/32 is applied to the inverted input terminals of comparators 521 and 523.

Figure 2:
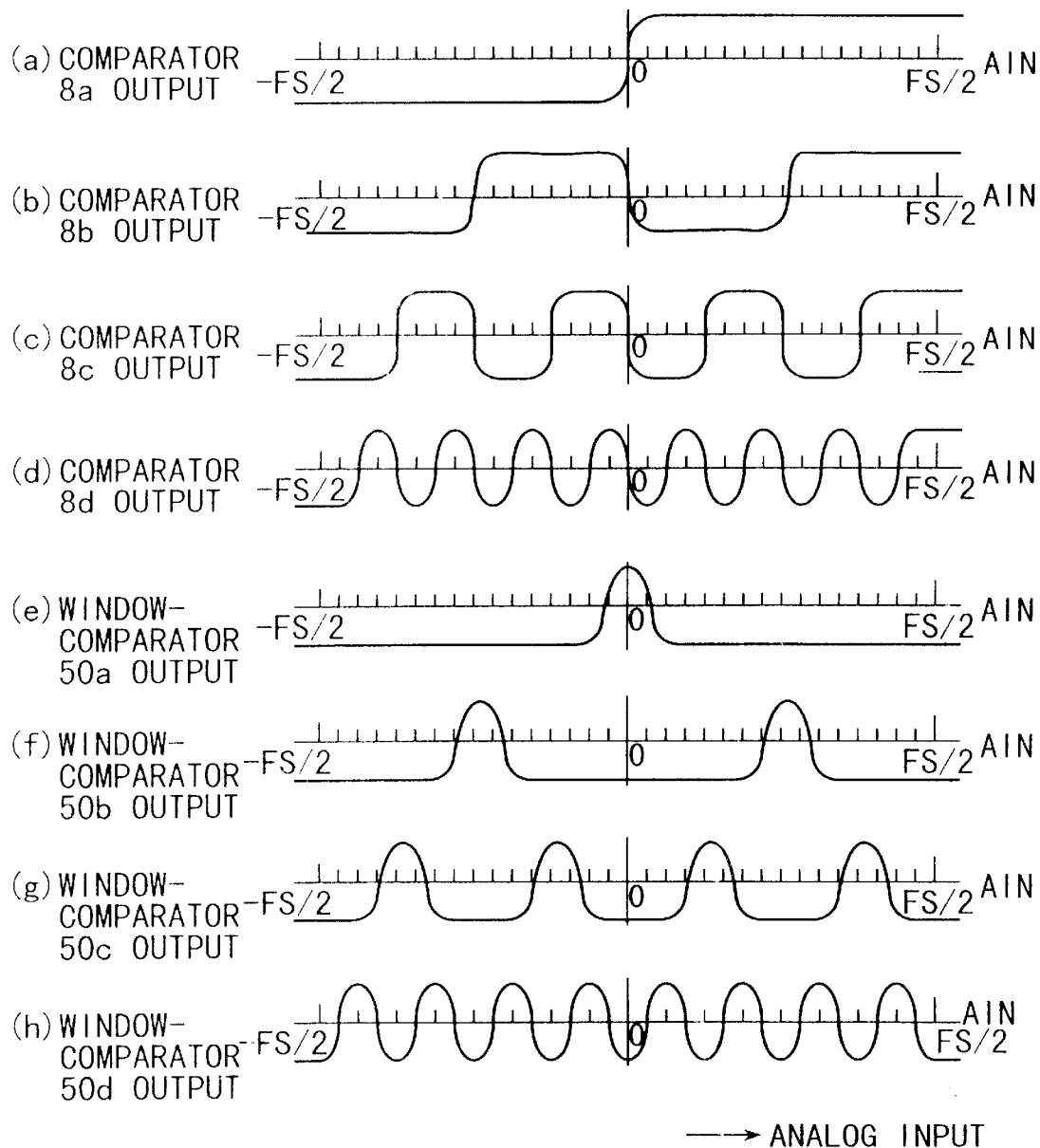
FIG. 2, comprising lines (a)–(h), is a diagram depicting characteristic curves illustrating operation of the device of FIG. 1.
Figure 17:
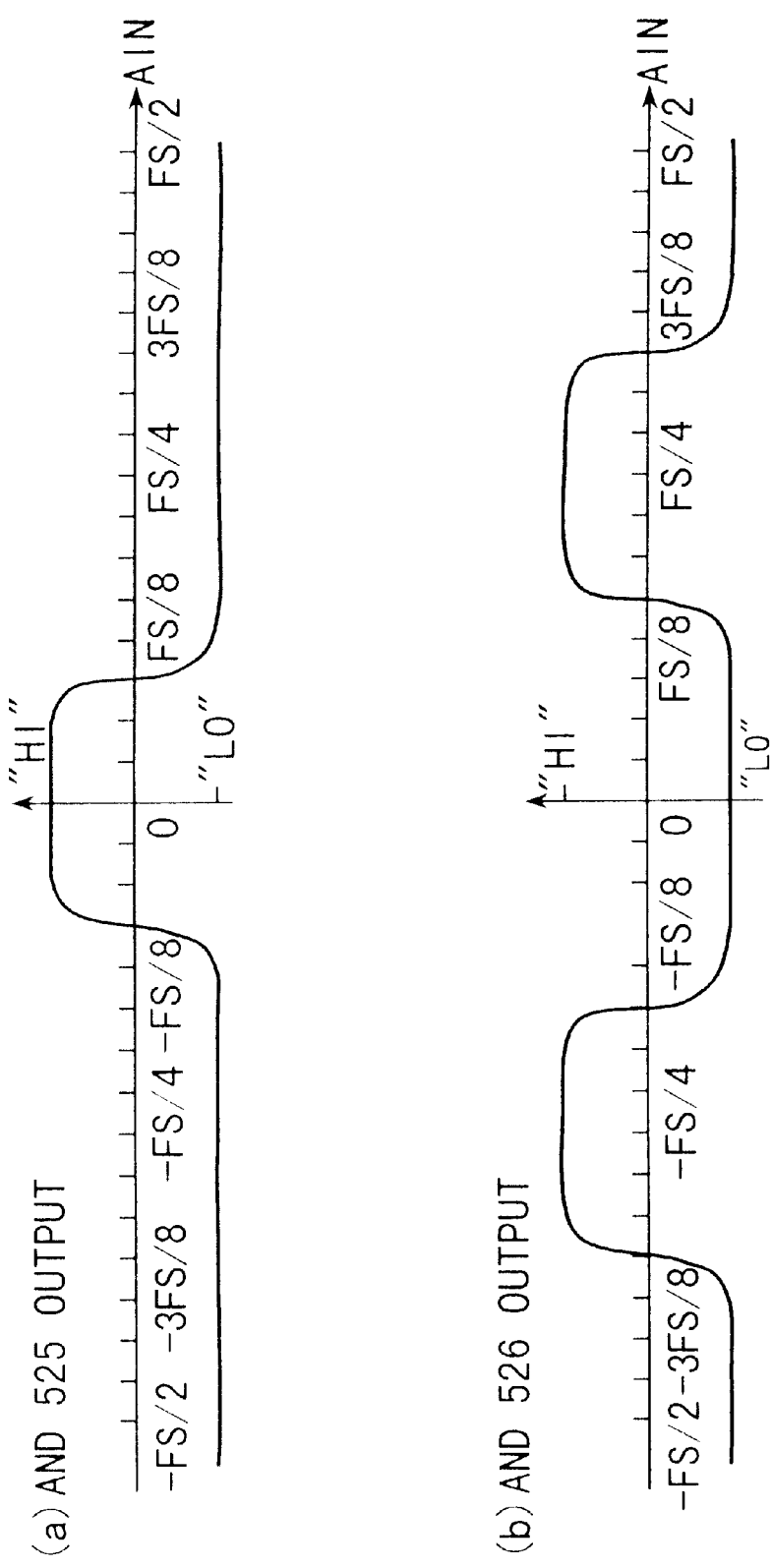
FIG. 17, comprising lines (a) and (b), is a diagram depicting characteristic curves illustrating operation of the embodiment of FIG. 16.

Operation of the embodiment of FIG. 16 will now be described with reference to FIGS. 17, 2 and 3. The characteristic curves for the embodiment are similar to those shown in FIGS. 2 and 3, except that in line (a) of FIG. 2 shows analog input signal 10b. In FIG. 17, line (a) shows the output signal from AND circuit 525, line (b) shows the output signal from AND circuit 526.

Each of comparators 8a–8d judges the zero crossing of the analog input signal 10b, of the output signal from subtractor 11a, of the output signal from subtractor 11b, and of the output signal from subtractor 11c, respectively. Window comparator 50a outputs "high level" signals in the window width of FS/16 in each vicinity of "zero" of analog input signal 10b, as shown in line (e) of FIG. 2. AND circuit 525 in window comparator 52a outputs "high level" signals in the window width of 3FS/16 in each vicinity of "zero" of analog input signal 100b as shown in line (a) of FIG. 17.

As shown in line (b) of FIG. 2, window comparator 50b can output "high level" signals in the window width of FS/16 in each vicinity of "zero" of analog input signal 100b. However, since the output signal from comparator 52a in the preceding stage in the vicinity of "zero" of analog input signal 100b is at a "high level", the output signal from window comparator 50b is at a "high level" only in each vicinity of "±FS/4", as shown in line (f) of FIG. 2.

As shown in line (b) of FIG. 2, window comparator 52b comprising ADN circuit 526 can output "high level" signals in the window width of 3FS/16 in each vicinity of "zero" and "±FS/4" of analog input signal 100b. However, since the output signal from comparator 52a in the preceding stage in each vicinity of "zero" of the analog input signal 100b, is at a "high level", the output signal from the window comparator 52b is at a "high level" only in each vicinity of "±FS/4", as shown in line (b) of FIG. 17.

As shown in line (c) of FIG. 2, window comparator 50c can output signals of "high level" in 15 positions. However, since the portions where the output signal for window comparators 50a–50c in previous stages are at a "high level" are excepted, the output signal from window comparator 50d becomes of "high level" in eight positions of window width of FS/16, as shown in line (h) of FIG. 2.

The output signals from EOR circuits 18–20 compare "gray" codes of intermediate bits in digital signal 101b and produce spike like noise as shown in lines (i)–(k) of FIG. 3. This is caused by changes from "high level" to "low level" or from "low level" to "high level" in the output signal from comparators 8a–8d, which are not steep. Error correction circuit 51 eliminates the spike like noise, as shown in lines (m)–(o) of FIG. by correcting the portions where the spike like noise is generated using the output signal from window comparators to mask the spike like noises. That is, the spike like noise, shown in lines (i)–(k) of FIG. 3 is eliminated by masking with the output signal from comparator 52a, the output signals from window comparators 52a and 52b, and the output signals from window comparators 50a,50b, and 50c, respectively.

Advantageously, since the code changes are detected using the window widths in two stages using the window comparators 50a,50b, 52a and 52b, error elimination or rejection by the error correction circuit 51 can be done selectively for the different bits. That is, advantageously, effects due to noise are reduced or completely eliminated and accuracy is increased substantially by taking wider window widths, for example, in the upper bits.

Moreover, the invention attains the advantage of being applicable to cascade A/D converters that provide binary codes; but, the invention is not so limited and may also provide "gray" codes. Also, advantageously, the invention is not limited by the number of output bits. Moreover, the same effects are attainable when the gains of the subtractors 11d–11f and amplifiers 60a–60c are larger than a factor of one and not limited to a factor of two. Also, advantageously, configurations may be used wherein amplifying function may be used in the analog multiplexers. Moreover, the window comparators 50a 50h, 52a, 52b, and 70a–70h which are used as means for detecting each vicinity of code changing points may comprise the circuitry shown in FIG. 18.

Figure 18:
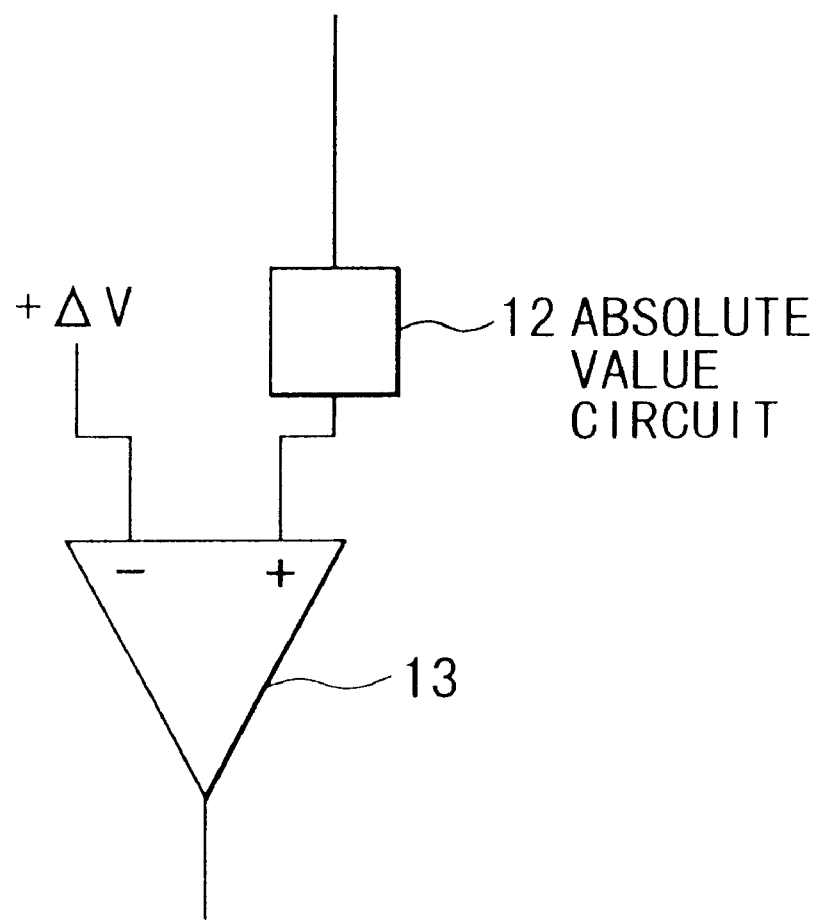
FIG. 18 is a drawing depicting an illustrative window comparator.

In FIG. 18, the window comparator comprises absolute value circuit 12 and comparator 13. Taking the device shown in FIG. 4 as an example, absolute value circuit 12 provides an absolute value when analog input signal 100b is inputted thereinto, together with the output signal from analog multiplexer 61a, the output signal from analog multiplexer 61b, or the output signal from subtractor 11f.

In comparator 13, the output signal from absolute value circuit 12 is applied to the positive logic input terminal thereof and +ΔV(+FS/16, +FS/32, +FS/8 or +FS/4) is applied to the negative logic input terminal. The output signal from comparator 13 becomes the output signal from AND circuit 14a, the output signal from AND circuit 15a, the output signal from AND circuit 16, or the input signal applied to the two positive logic input terminals of AND circuit 17a. The means for detecting each vicinity of code changing points uses two or three stages of window widths. However, four or more stages may also be used.

The foregoing description is illustrative of the principles of the invention. Numerous modifications and extensions thereof would be apparent to the worker skilled in the art. All such extensions and modifications are to be construed to be within the spirit and scope of the invention.

What is claimed is:

1. A cascade A/D converter comprising:
   first comparator means for converting an analog input signal into a first digital signal
   latch means for holding said first digital signal;
   D/A converter means for converting said first digital signal to a first analog signal;
   subtractor means for subtracting said first analog signal from said analog input signal and for outputting a subtract output signal;
   waveform composition means for composing code changing waveforms of said analog input signal utilizing said subtract output signal;
   window comparator means for detecting each vicinity of code changing points of said analog input signal for one stage and of said changing waveforms in other stages and for outputting an output signal; and
   error correction means for rejecting noise generated at said code changing points based on first digital signal and on output signals from said waveform composition means and from said window comparing means.

2. The converter of claim 1, wherein said waveform composition means comprises amplifier means having same gain as said subtractor means and for receiving signals applied to said window comparator means in a preceding stage as an input signal, and for sending out an inverted or non-inverted output signal; and analog multiplexer means for selecting an output signal from said amplifier means and an output signal from said subtractor means in a preceding stage and for sending out an output signal to said window comparator means.

3. The converter of claim 2, wherein gain of said subtractor means and gain of said amplifier means are larger than one.

4. The converter of claim 1, wherein said window comparing means comprises means for detecting code changes during a particular time window width at each vicinity of code changing points.

5. The converter of claim 4, wherein said waveform composition means comprises amplifier means having same gain as said subtractor means and for receiving signals applied to said means for detecting in a preceding stage as an input signal, and for sending out an inverted or non-inverted output signal; and analog multiplexer means for selecting an output signal from said amplifier means and an output signal from said subtractor means in a preceding stage and for sending out an output signal to sa-id means for detecting.

6. The converter of claim 4, wherein said code changing points are greater in upper bits than in lower bits.

7. The converter of claim 6, wherein said waveform composition means comprises amplifier means having same gain as said subtractor means and for receiving signals applied to said means for detecting in a preceding stage as an input signal, and for sending out an inverted or non-inverted output signal; and analog multiplexer means for selecting an output signal from said amplifier means and an output signal from said subtractor means in a preceding stage and for sending out an output signal to said means for detecting.

8. The converter of claim 1, wherein said window comparing means comprises means for detecting code changes during a particular time window width at each vicinity of code changing points which are greater in upper bits than in lower bits.

9. The converter of claim 8, wherein said waveform composition means comprises amplifier means having same gain as said subtractor means and for receiving signals applied to said means for detecting in a preceding stage as an input signal, and for sending out an inverted or non-inverted output signal; and analog multiplexer means for selecting an output signal from said amplifier means and an output signal from said substractor means in a preceding stage and for sending out an output signal to said means for detecting.

10. The converter of claim 8, wherein gain of said subtractor means and gain of said amplifier means are larger than one.

11. A cascade A/D converter comprising:
   first comparator means for comparing an analog input signal with a first analog signal for all upper bits and for outputting a first digital signal;
   latch means for holding said first digital signal outputted from said first comparator means;
   D/A converter means for converting said first digital signal outputted from said first comparator means to a second analog signal;
   waveform composition means for composing code changing waveforms from said first digital signal outputted from said D/A converter means;
   window comparator means for detecting each vicinity of code changing points of said code changing waveforms; and
   error correction means for rejecting noise generated at code changing points based on output signals from said first digital signal, said waveform composition means and said window comparing means.

12. The converter of claim 11, wherein said waveform composition means comprises analog multiplexer means for selecting inverted or non-inverted input terminals of said comparator means, and for outputting signals to said means for detecting.

13. The converter of claim 11, wherein said window comparing means comprises means for detecting code changes during a particular time window width at each vicinity of code changing points which are greater in upper bits than in lower bits.

14. The converter of claim 13, wherein said waveform composition means comprises analog multiplexer means for selecting inverted or non-inverted input terminals of said comparator means, and for outputting signals to said means for detecting.

15. A cascade A/D converter configured by connecting in cascade a plurality of stages, each stage comprising:
- a first comparator means for converting an analog input signal into a first digital signal;
- latch means for holding said first digital signal;
- D/A converter means for converting said first digital signal from said first comparator into a first analog signal;
- subtractor means for subtracting said first analog signal from said analog input signal and for outputting a subtracted output signal;
- window comparator means for detecting each vicinity of code changing points to detect code changes of said analog input signal during a particular time duration in two or more stages; and
- error correction means for rejecting noise generated at code changing points based on output signals from said first digital signal, said subtractor means and said window comparator means.

16. The converter of claim 15, wherein said detecting to window comparing means for detecting comprises:
- absolute value means for receiving each changing waveform in said waveform composition means as an input signal and for obtaining an absolut value; and
- second comparator means for using the absolute value from said absolute value means for comparison.

17. The converter of claim 15, wherein said time duration during which said window comparator means detects said analog input signal in one stage is wider in time duration than said particular time duration in two or more stages.

18. The converter of claim 17, wherein said detecting to window comparing means for detecting comprises:
- absolute value means for receiving each changing waveform in said waveform composition means as an input signal and for obtaining an absolute value; and
- second comparator means for using the absolute value from said absolute value means for comparison.

* * * * *